United States Patent
Suzuki et al.

(10) Patent No.: US 7,569,875 B2
(45) Date of Patent: Aug. 4, 2009

(54) SEMICONDUCTOR DEVICE AND A METHOD FOR PRODUCING THE SAME

(75) Inventors: Takashi Suzuki, Aichi-ken (JP); Sachiko Tanaka, Aichi-ken (JP); Masayasu Ishiko, Aichi-ken (JP); Jun Saito, Aichi-ken (JP); Tsuyoshi Nishiwaki, Aichi-ken (JP); Yukihiro Hisanaga, Aichi-ken (JP); Hidehiro Nakagawa, Aichi-ken (JP); Hirokazu Saito, Aichi-ken (JP)

(73) Assignees: Kabushiki Kaisha Toyota Chuo Kenkyusho, Aichi-gun, Aichi-ken (JP); Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 0 days.

(21) Appl. No.: 11/717,790

(22) Filed: Mar. 14, 2007

(65) Prior Publication Data
US 2007/0221950 A1    Sep. 27, 2007

(30) Foreign Application Priority Data
Mar. 14, 2006    (JP) .............................. 2006-068466
Mar. 16, 2006    (JP) .............................. 2006-073527

(51) Int. Cl.
*H01L 29/80* (2006.01)
(52) U.S. Cl. .................. 257/287; 257/341; 257/401; 257/578; 257/E29.257
(58) Field of Classification Search ................. 257/287, 257/E29.257
See application file for complete search history.

(56) References Cited

U.S. PATENT DOCUMENTS

| 5,206,182 | A  | * | 4/1993  | Freeman ...................... 438/203 |
| 6,268,637 | B1 | * | 7/2001  | Gardner et al. ................ 257/522 |
| 6,498,069 | B1 | * | 12/2002 | Grivna ......................... 438/386 |
| 2004/0043565 | A1 | * | 3/2004  | Yamaguchi et al. ........... 438/268 |
| 2004/0217443 | A1 | * | 11/2004 | Davies ......................... 257/531 |
| 2005/0098826 | A1 | * | 5/2005  | Yamaguchi et al. ........... 257/341 |

FOREIGN PATENT DOCUMENTS

JP    5-190663    7/1993

(Continued)

*Primary Examiner*—Tu-Tu V Ho
(74) *Attorney, Agent, or Firm*—McGinn IP Law Group, PLLC

(57) ABSTRACT

A semiconductor device having a substrate; an emitter electrode or source electrode formed on the top surface side of the substrate; a gate electrode formed on the top surface side of the substrate; and a collector electrode or drain electrode formed on the bottom surface side of the substrate. The device includes an insulating region formed so as to surround a device-forming region provided on the top surface side of the substrate; and a drift region of the device-forming region, the drift region being in contact with the insulating region, is formed of a semiconductor layer having the same conduction type as that of a channel formed through application of an electric potential to the gate electrode. The gate electrode is a trench gate. An outer peripheral portion of the emitter electrode or source electrode extends in a width of 20 µm or more over the top surface of the insulating region. The insulating region includes, in its interior, a dielectric region having a relative dielectric constant lower than that of the insulating region.

9 Claims, 21 Drawing Sheets

FOREIGN PATENT DOCUMENTS

| | | |
|---|---|---|
| JP | 9-266311 | 10/1997 |
| JP | 11-233759 | 8/1999 |
| JP | 2001-217307 | 8/2001 |
| JP | 2001-244461 | 9/2001 |
| JP | 2001-267411 | 9/2001 |
| JP | 2004-335568 | 11/2004 |
| JP | 2005-19614 | 1/2005 |
| JP | 2005-197644 | 7/2005 |
| JP | 2005-228806 | 8/2005 |

* cited by examiner

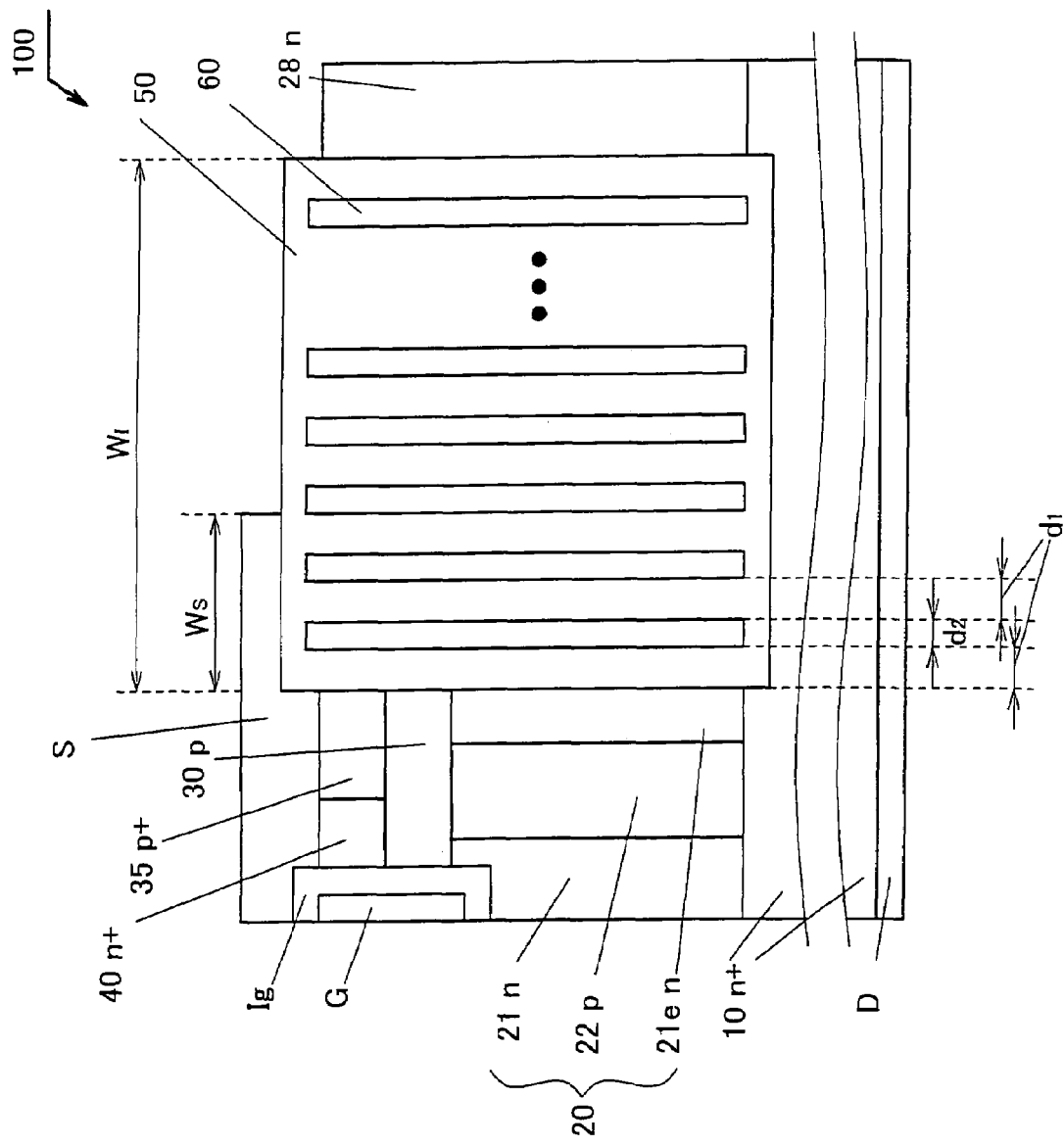
[Fig. 1]

[Fig. 2]
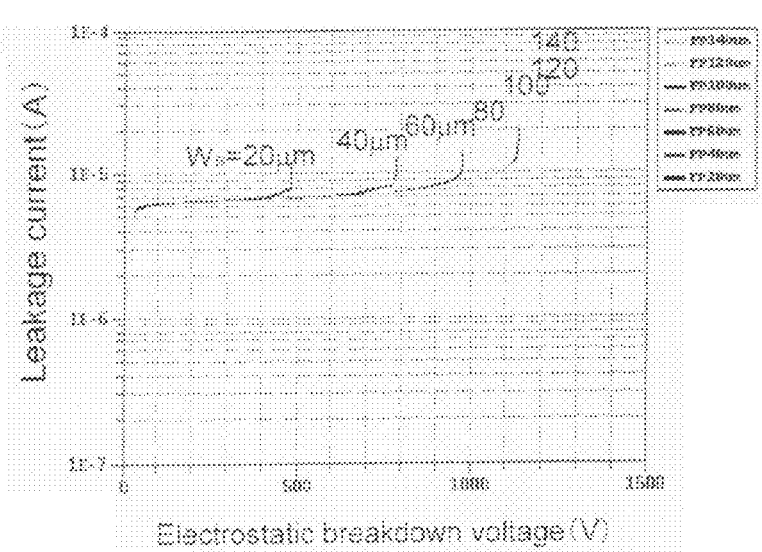
[Fig. 4]
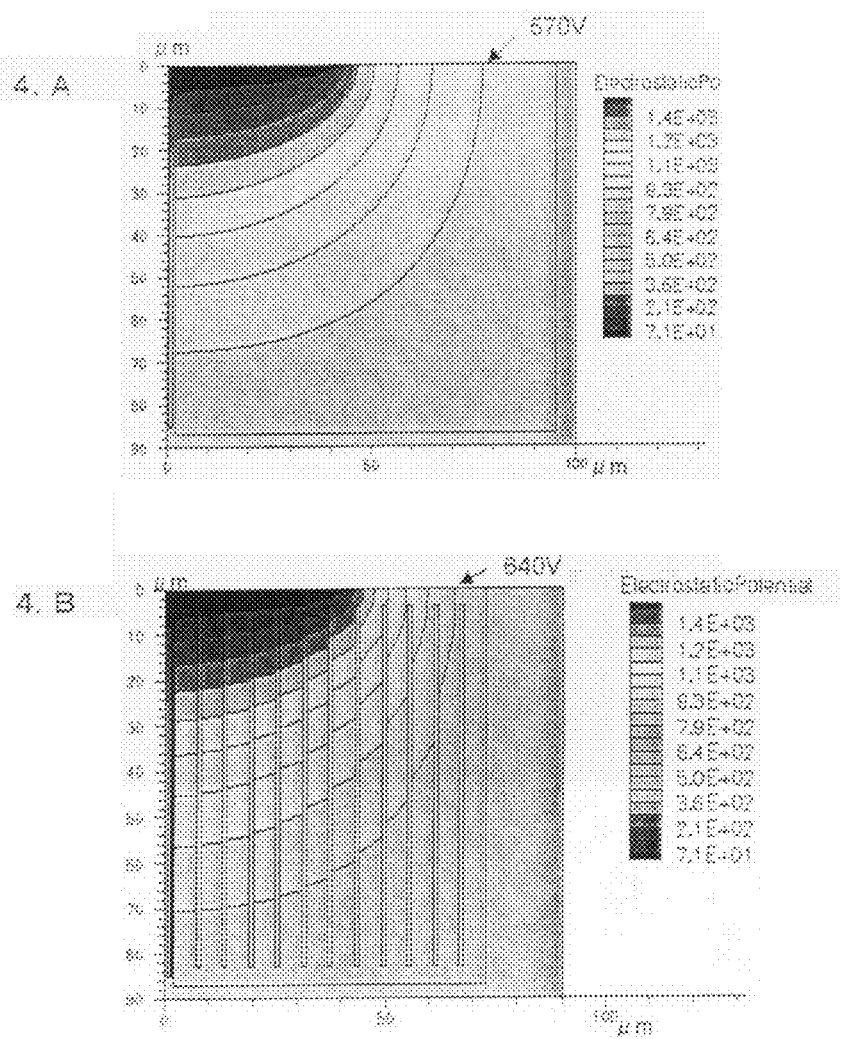

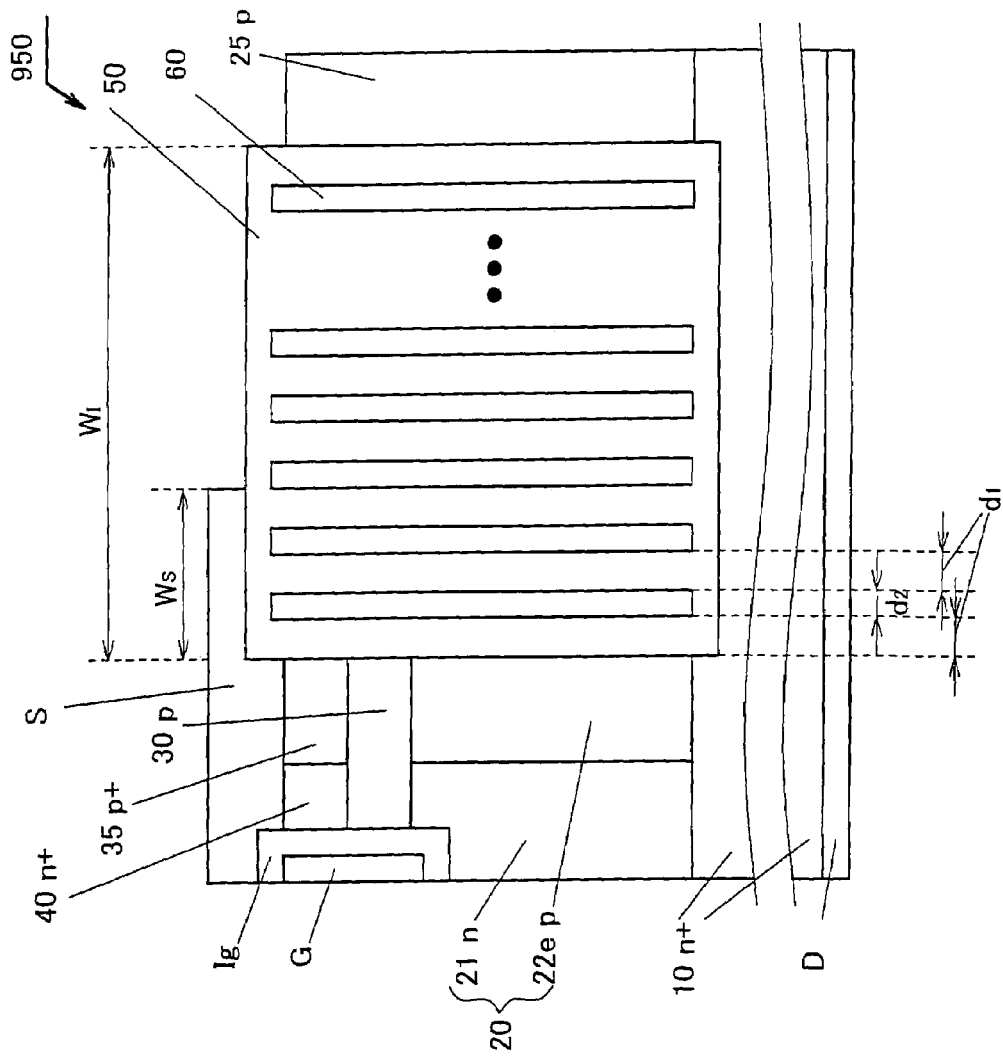
[Fig. 3]

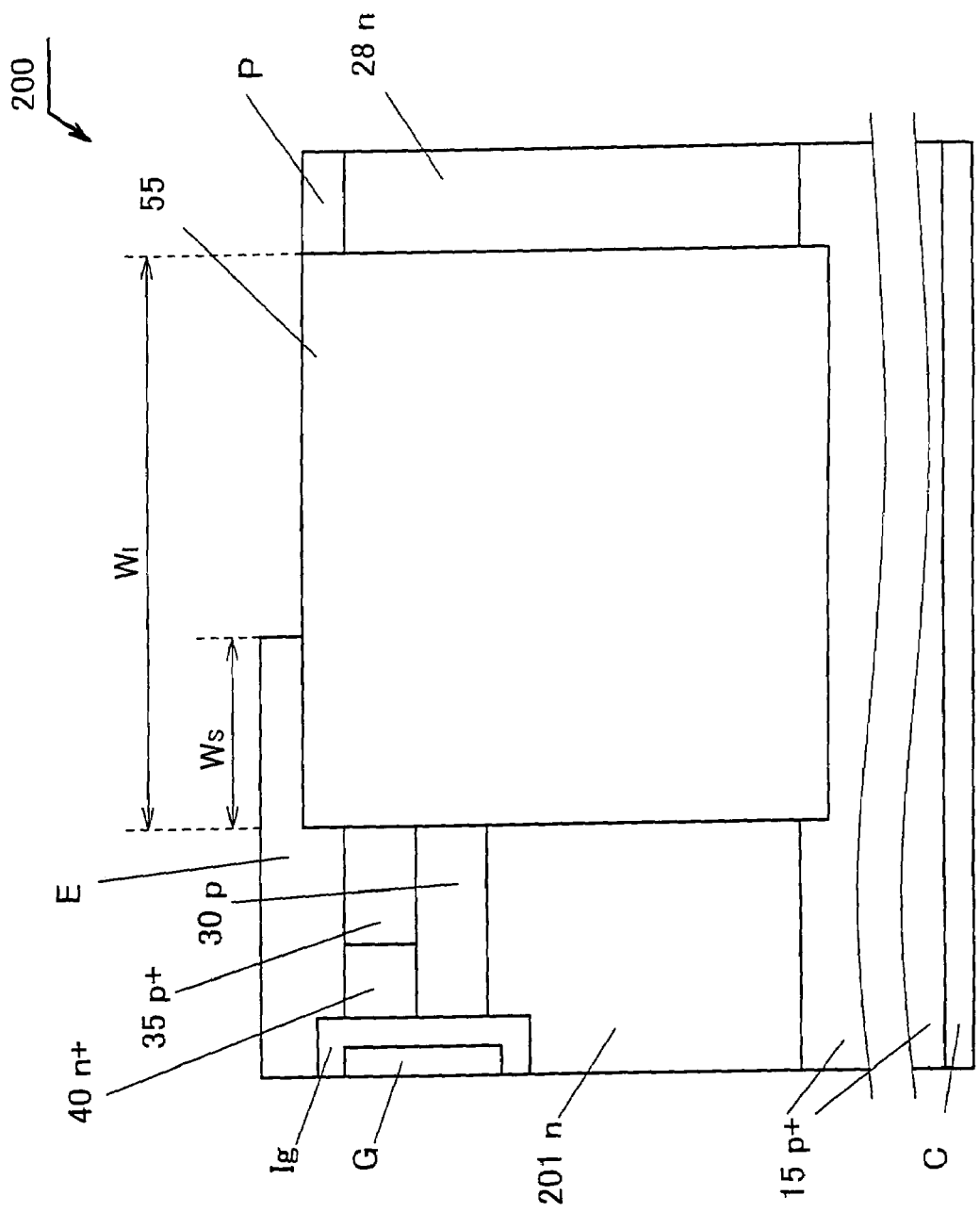
[Fig 5]

[Fig. 6]
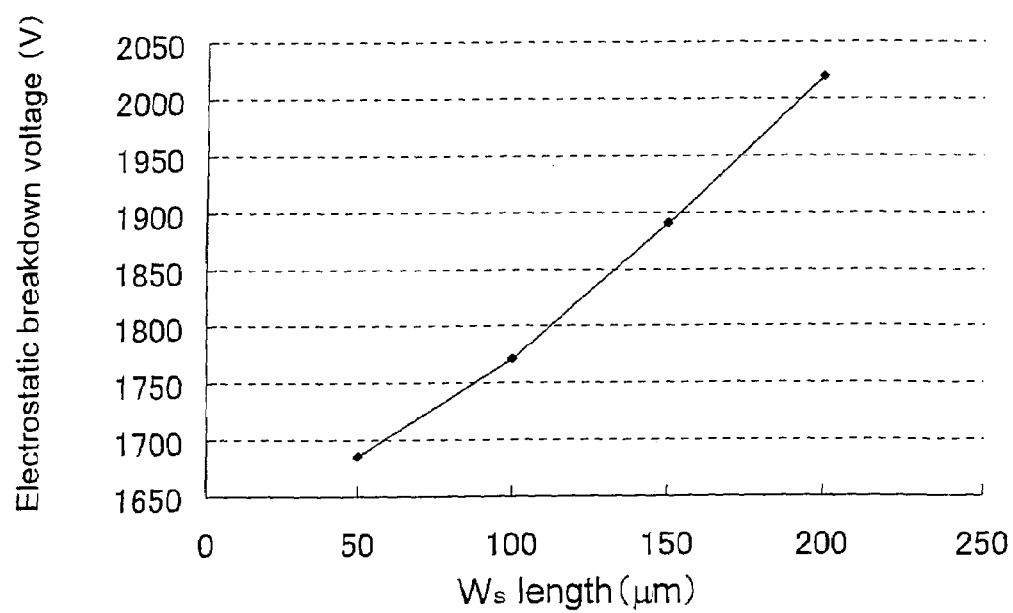

【Fig. 7.A】
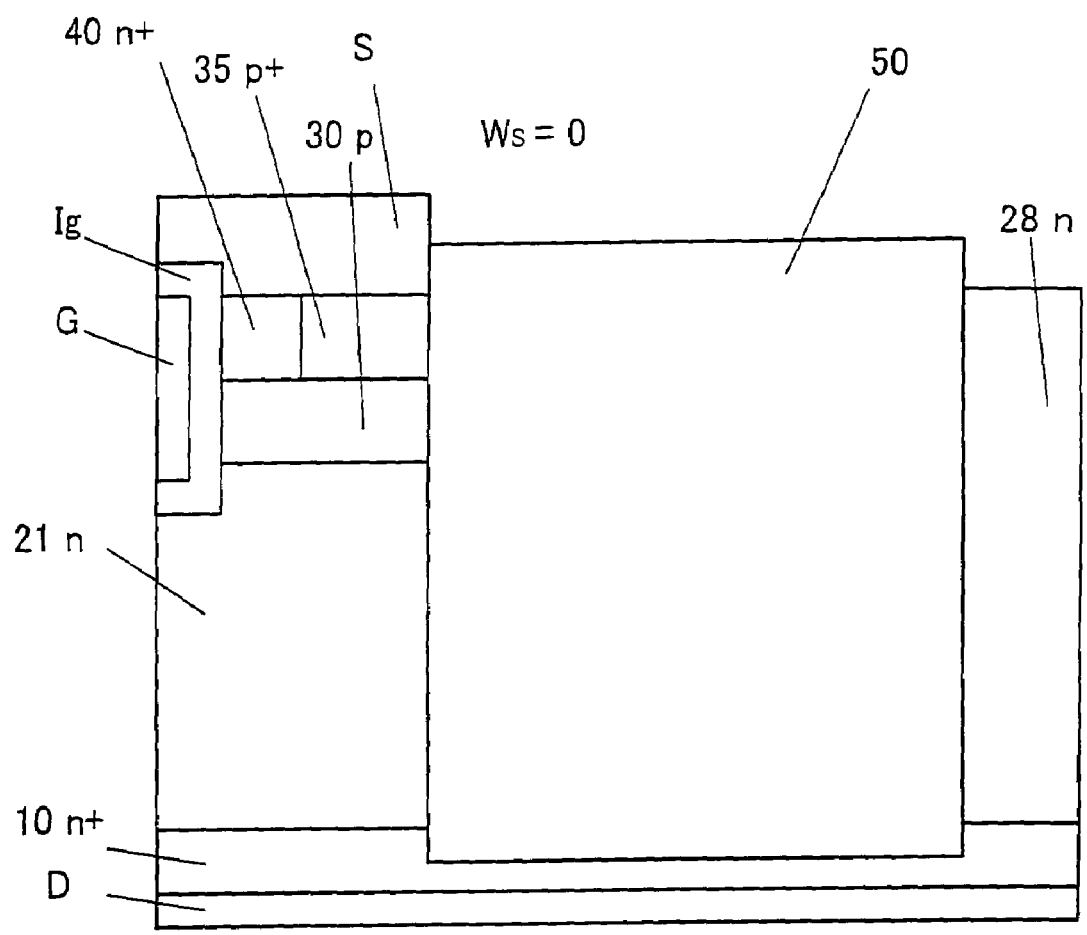

[Fig. 7.B]
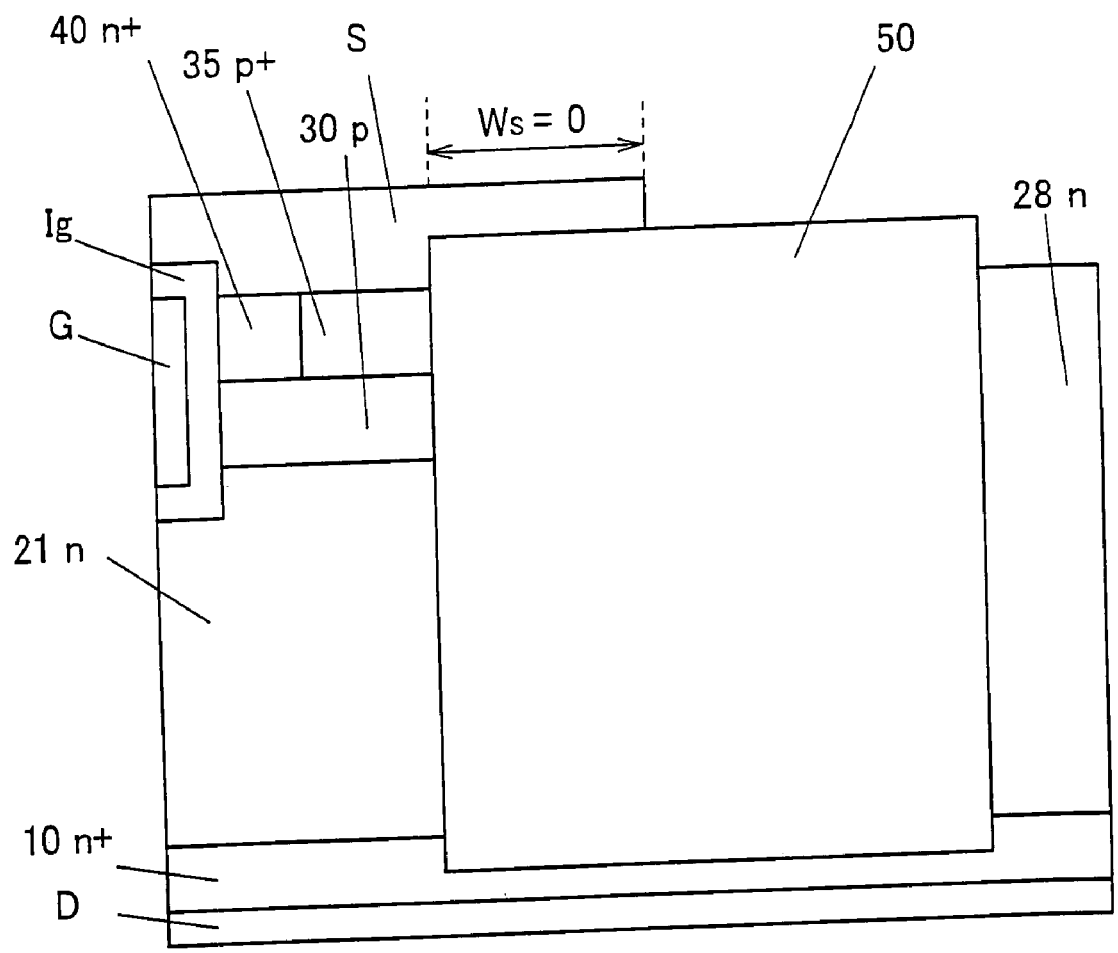

[Fig. 7.C]
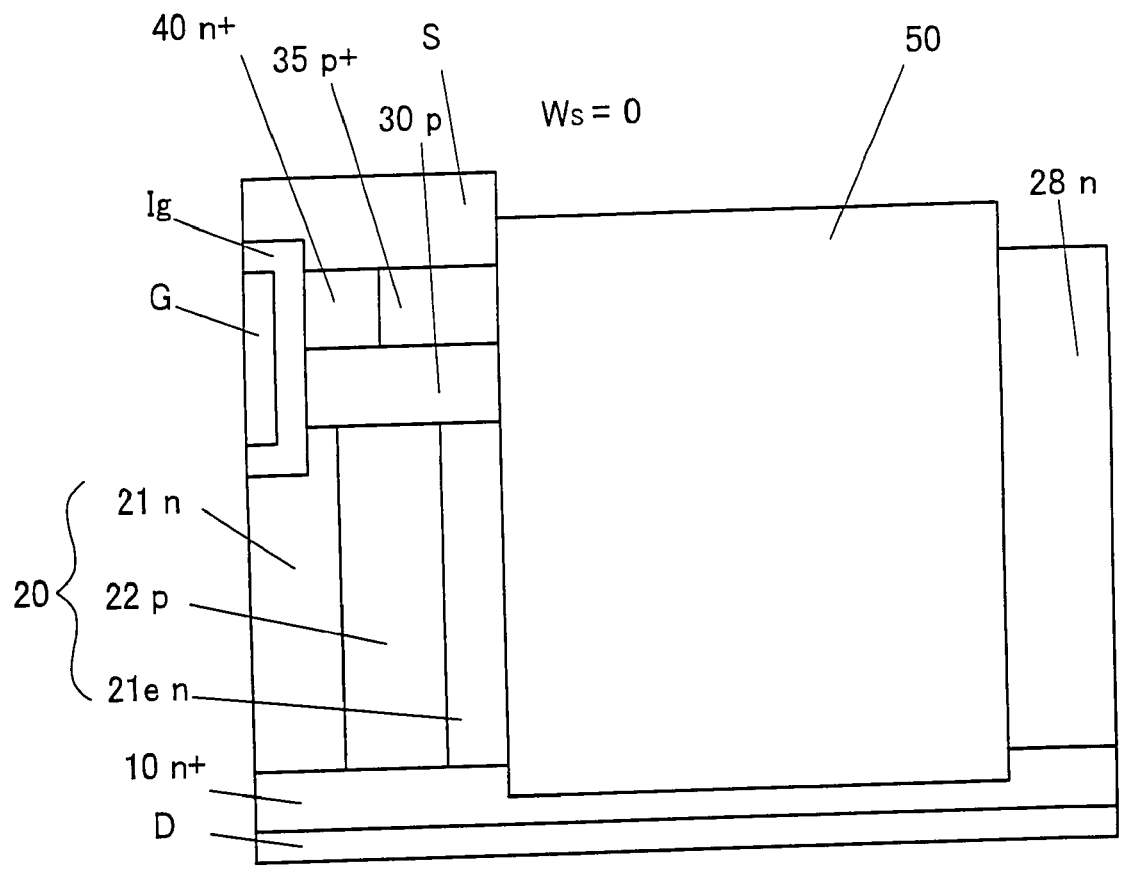

[Fig. 7.D]
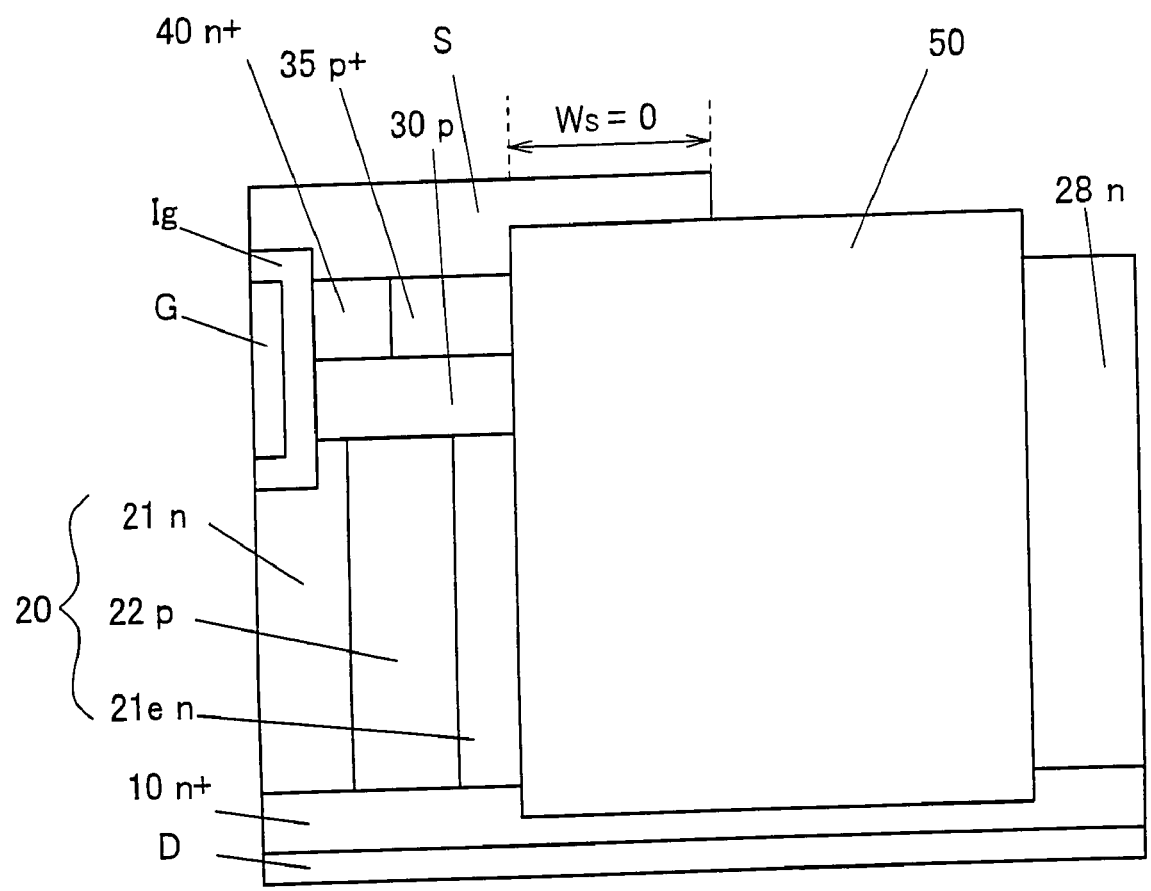

[Fig. 7.E]
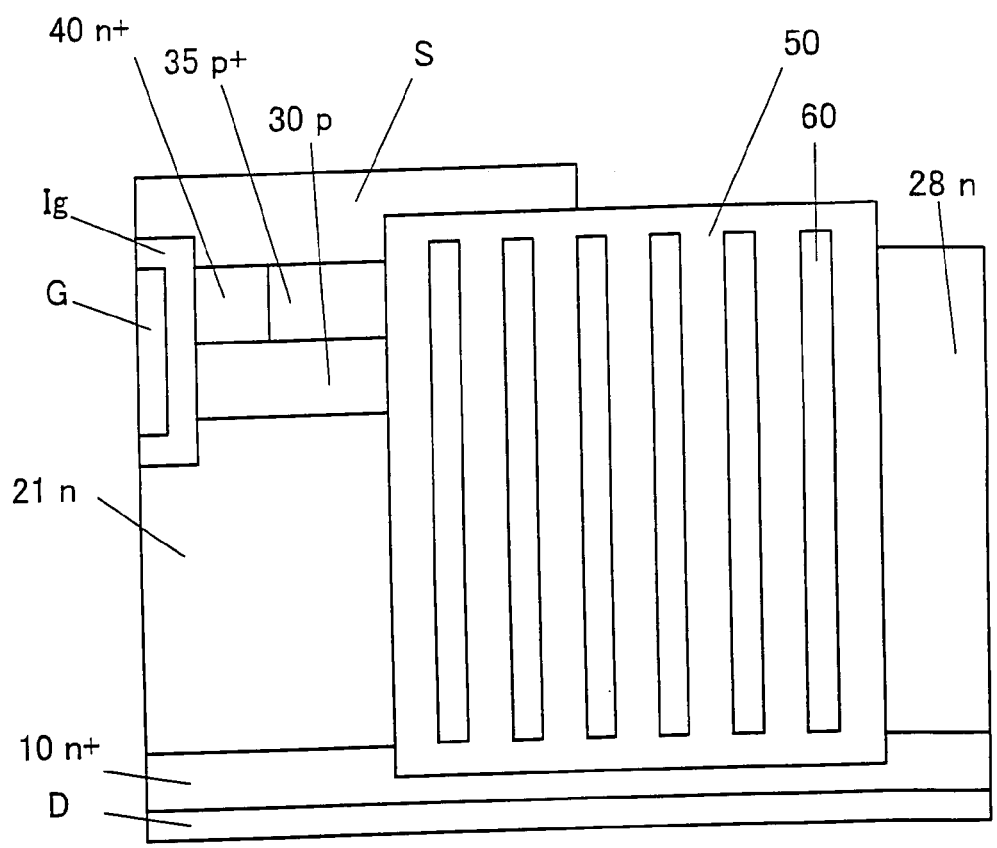

[Fig. 7.F]
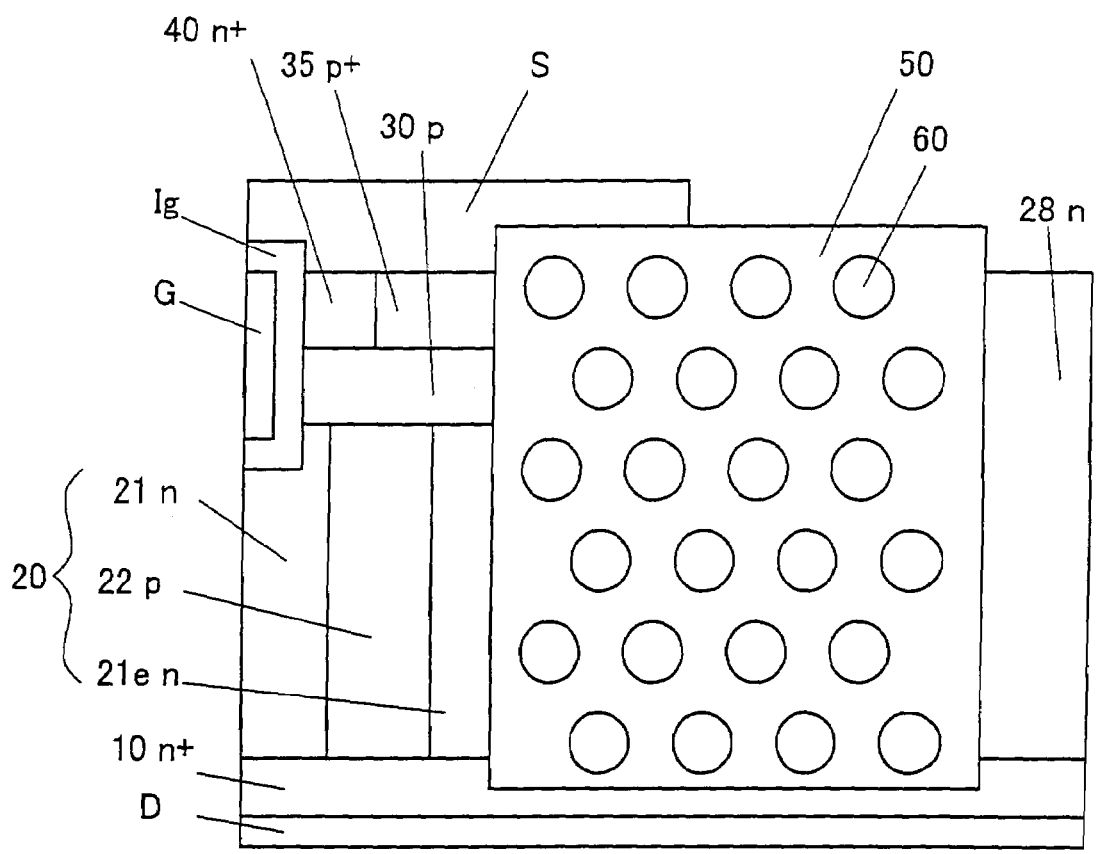

[Fig. 7.G]
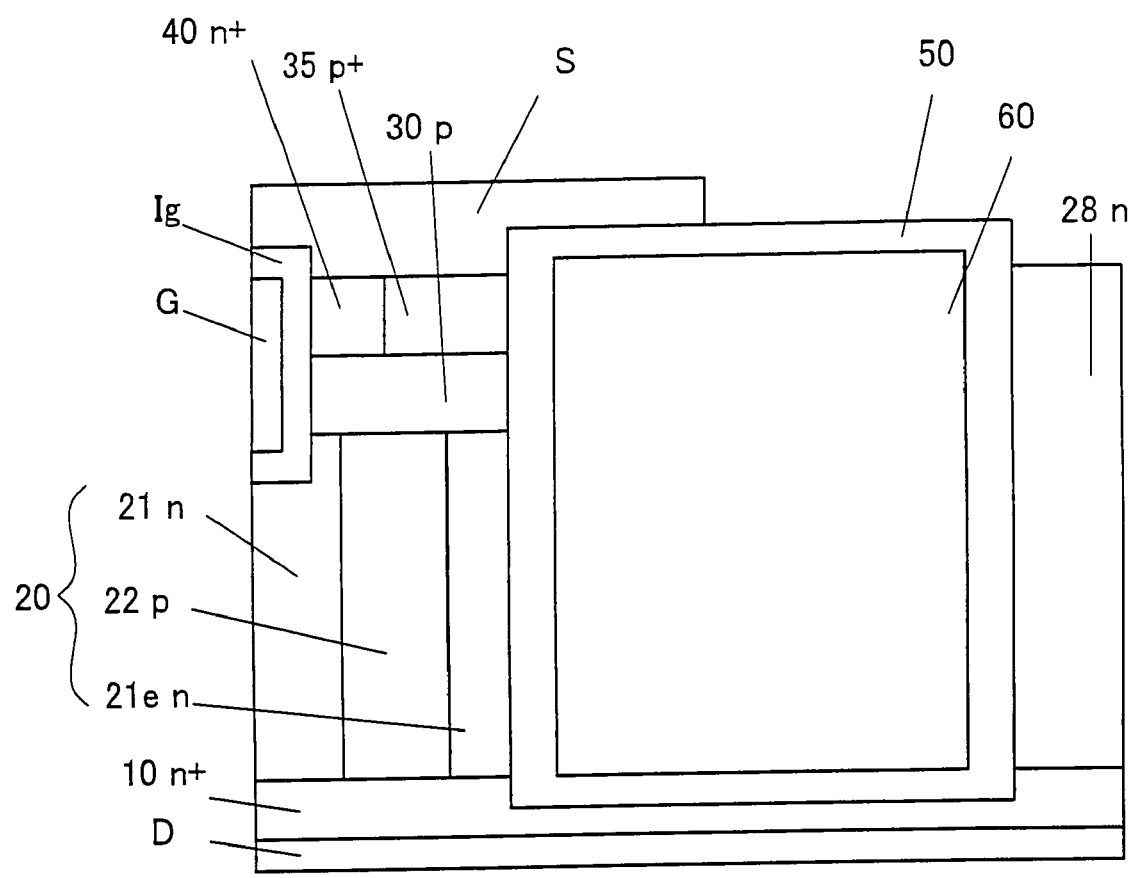

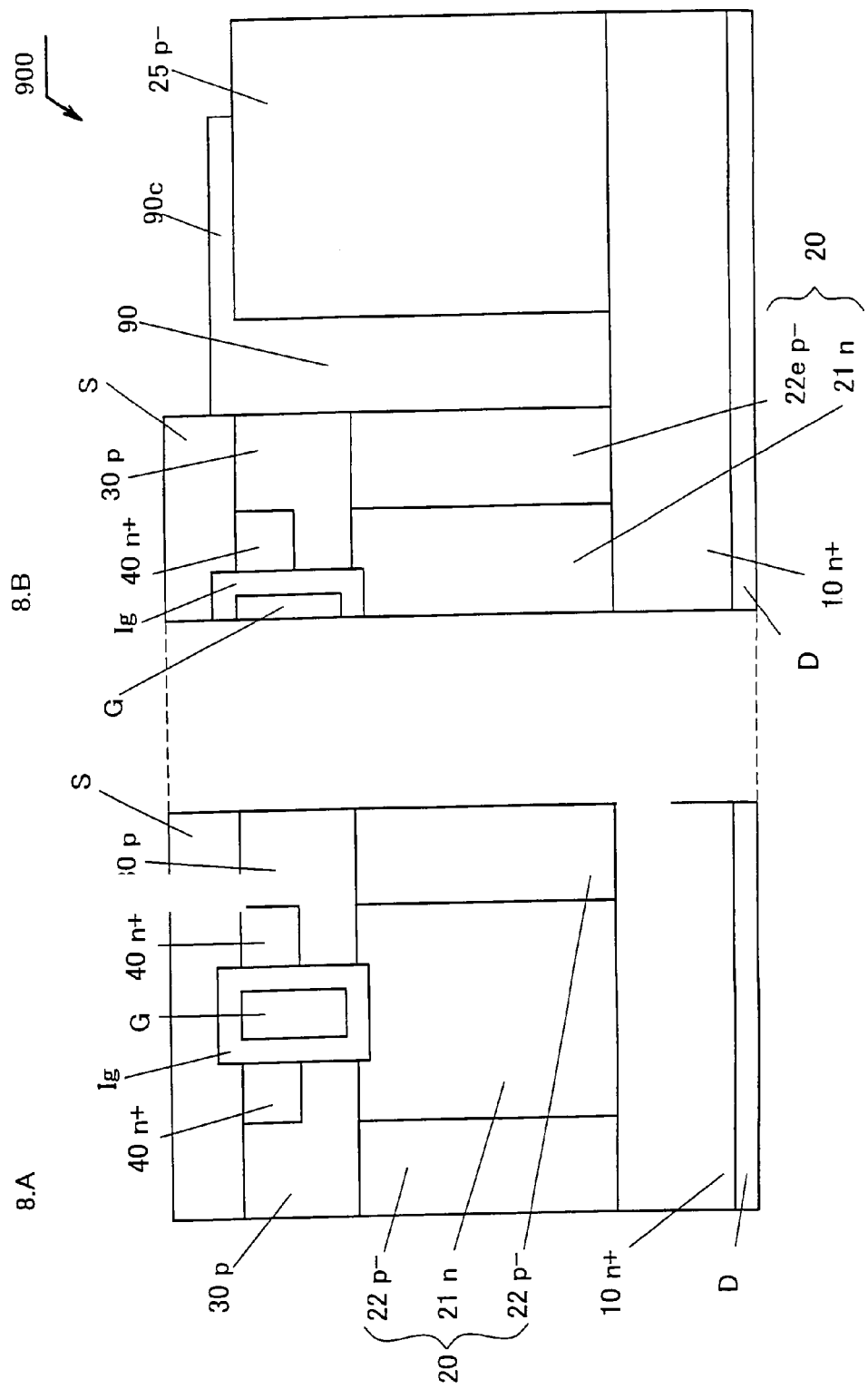
[Fig. 8]

[Fig. 9]
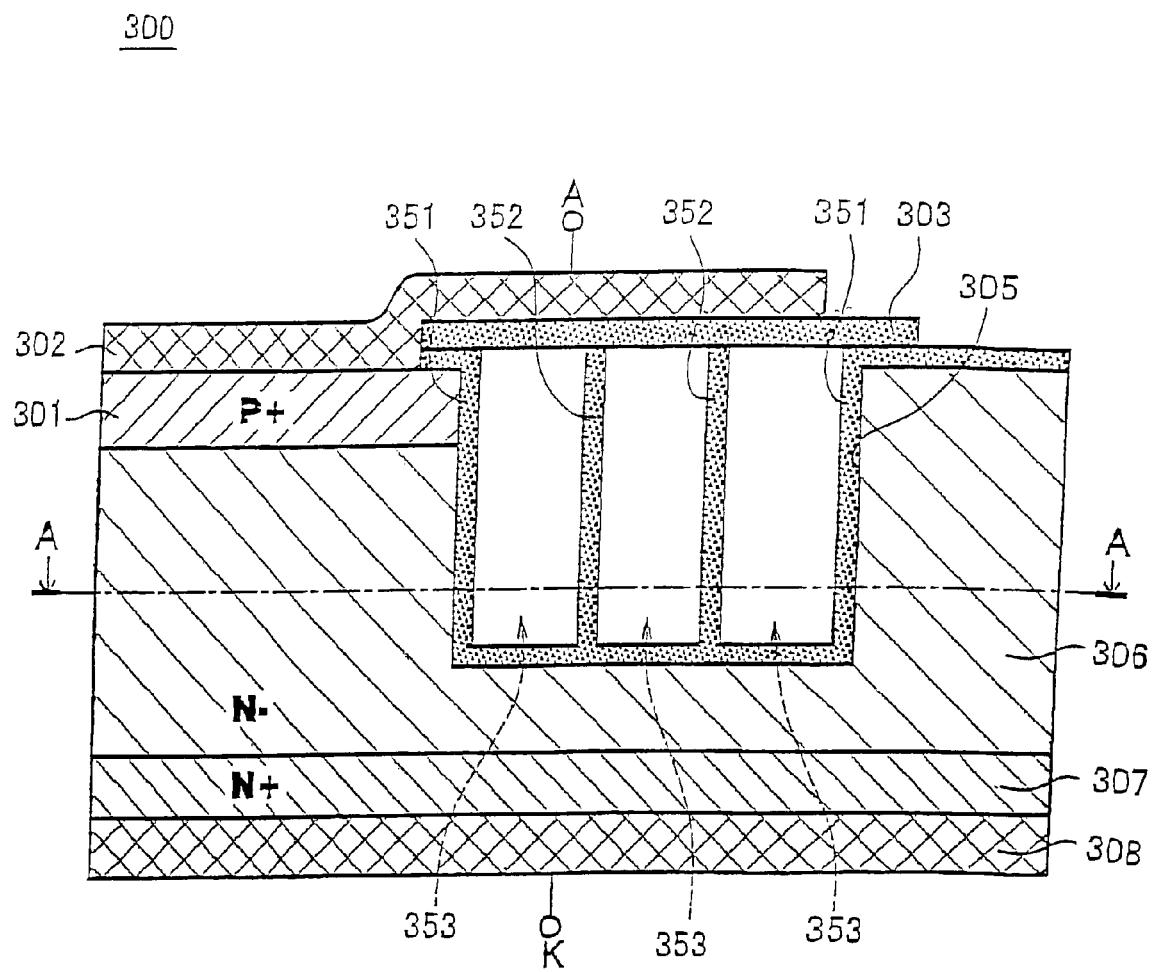

[Fig. 10]
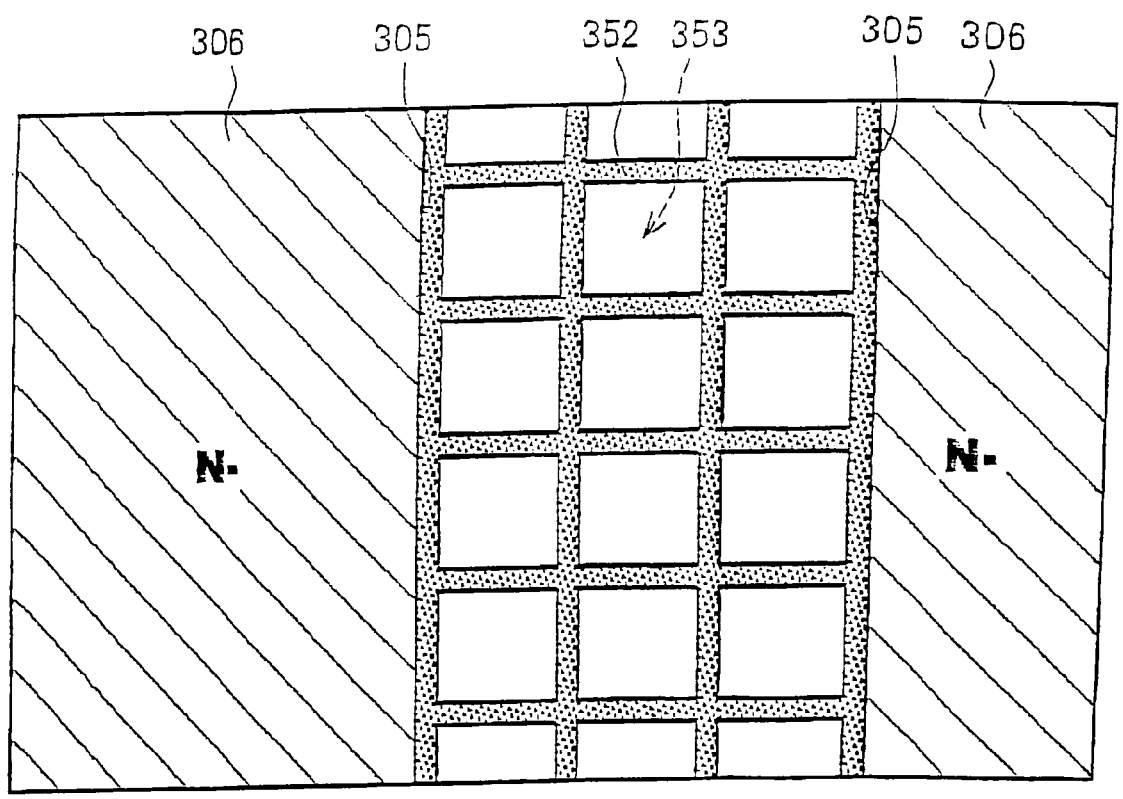

[Fig. 11]
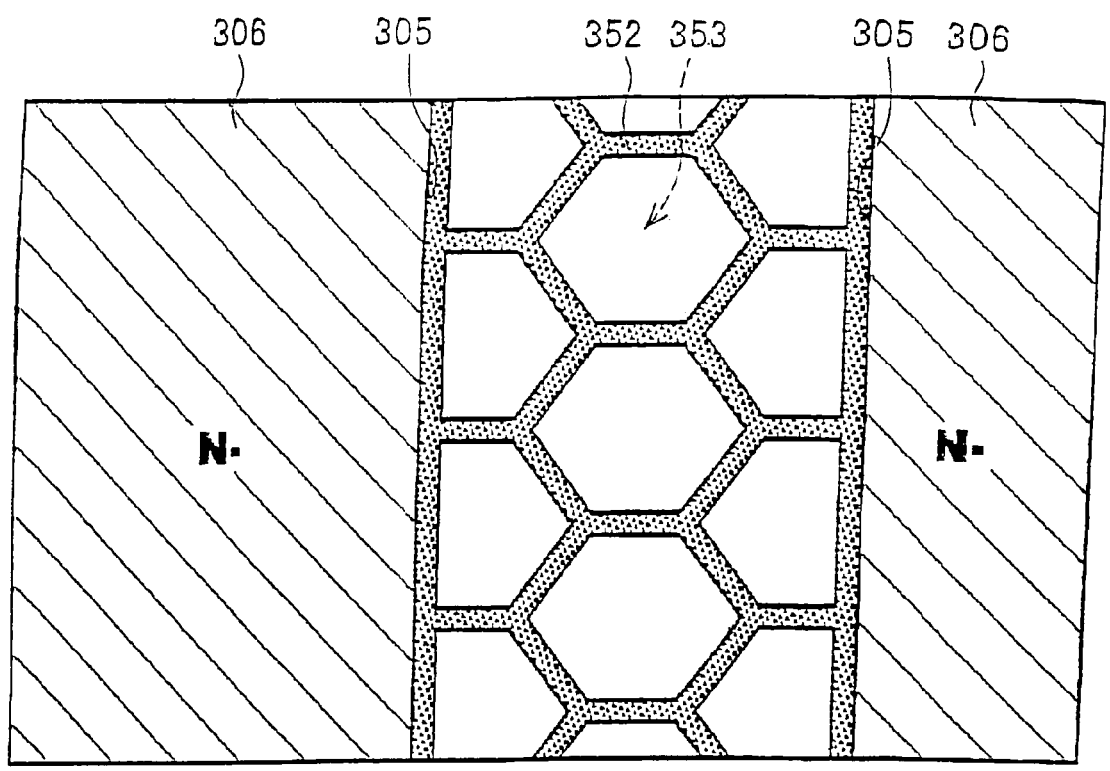

[Fig. 12]
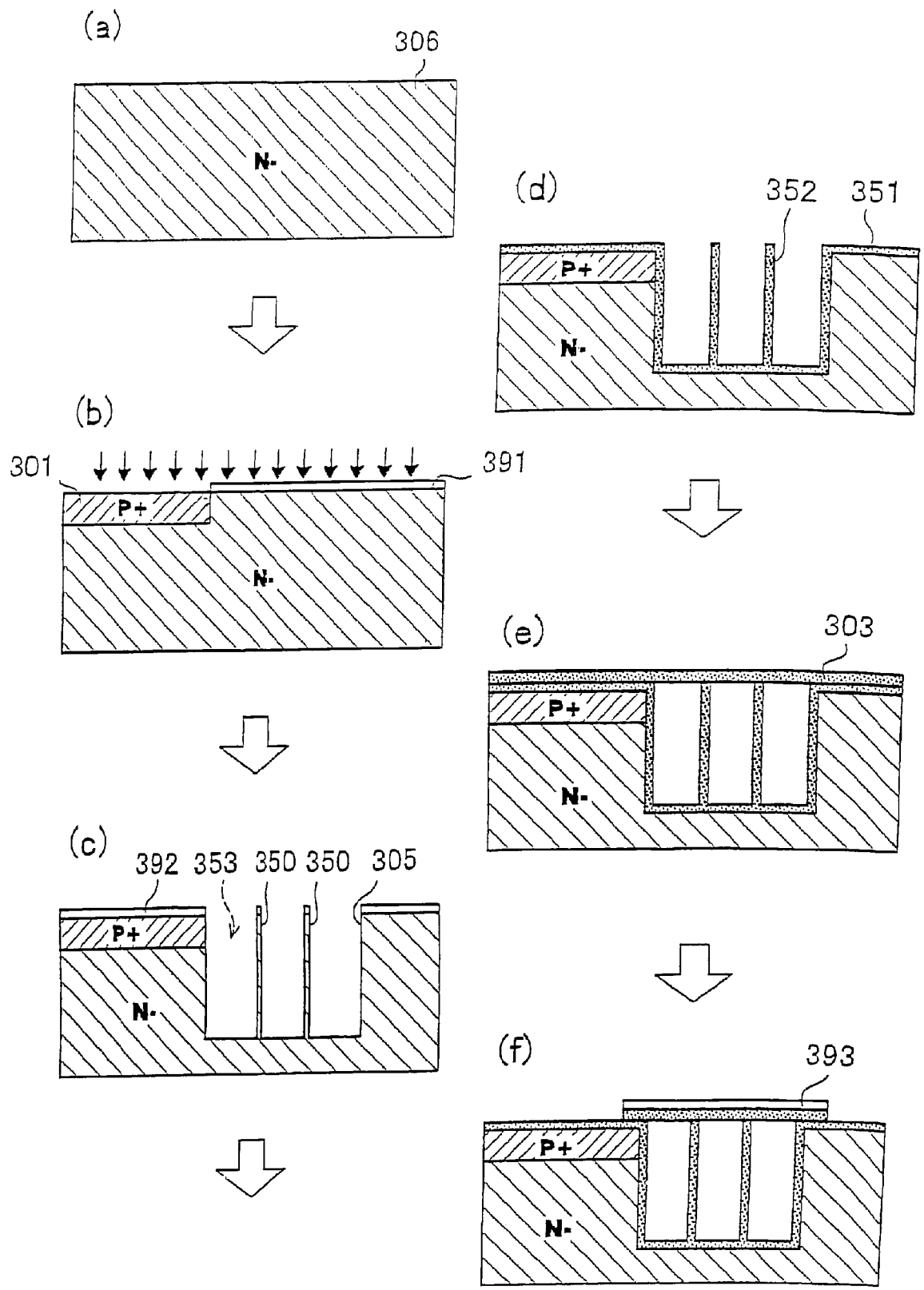

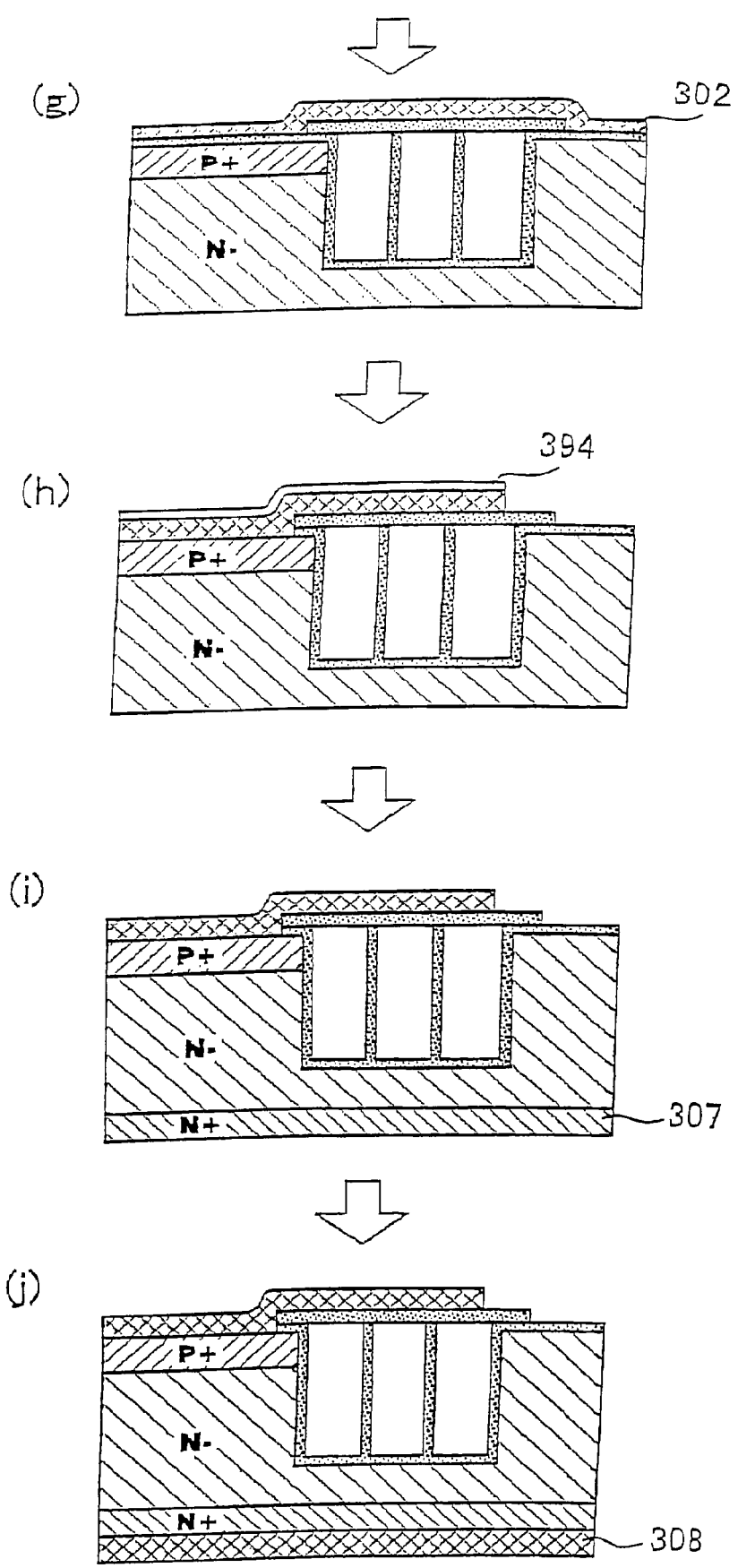
[Fig. 13]

[Fig. 14]
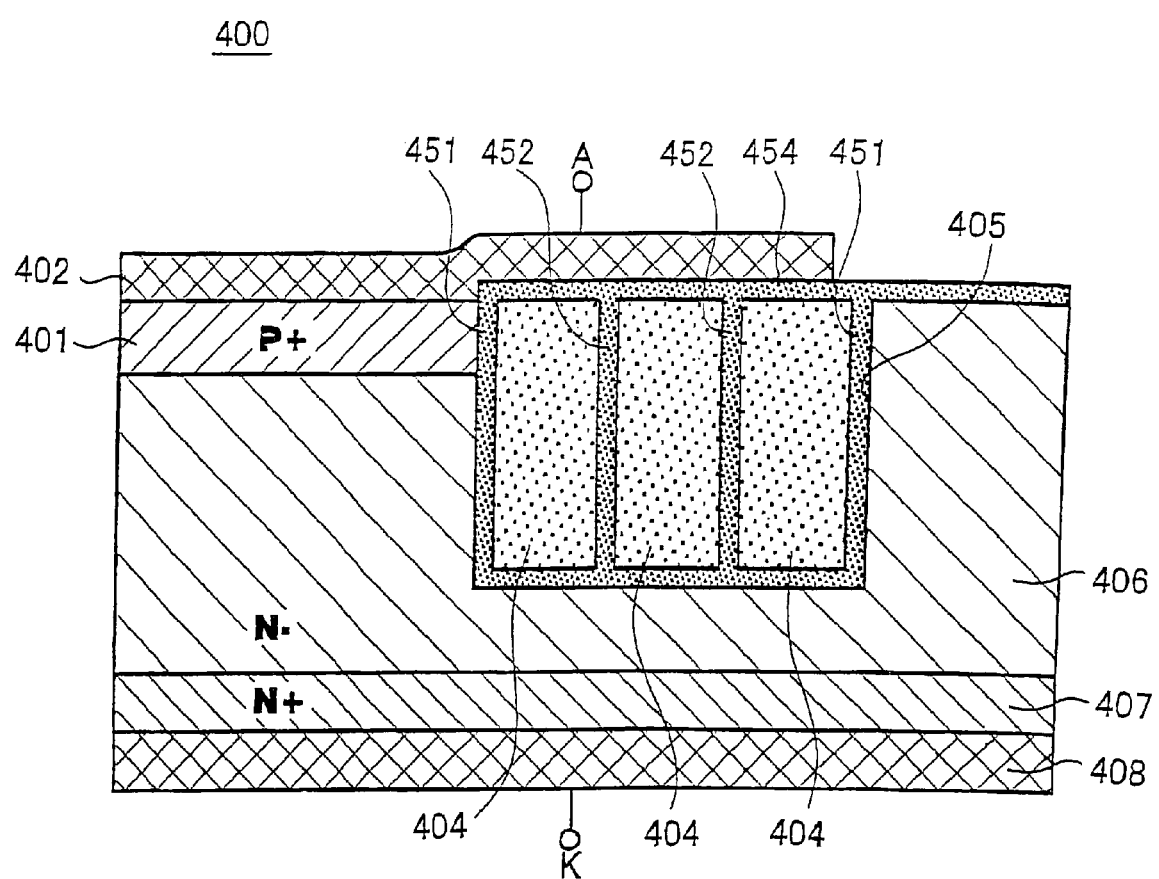

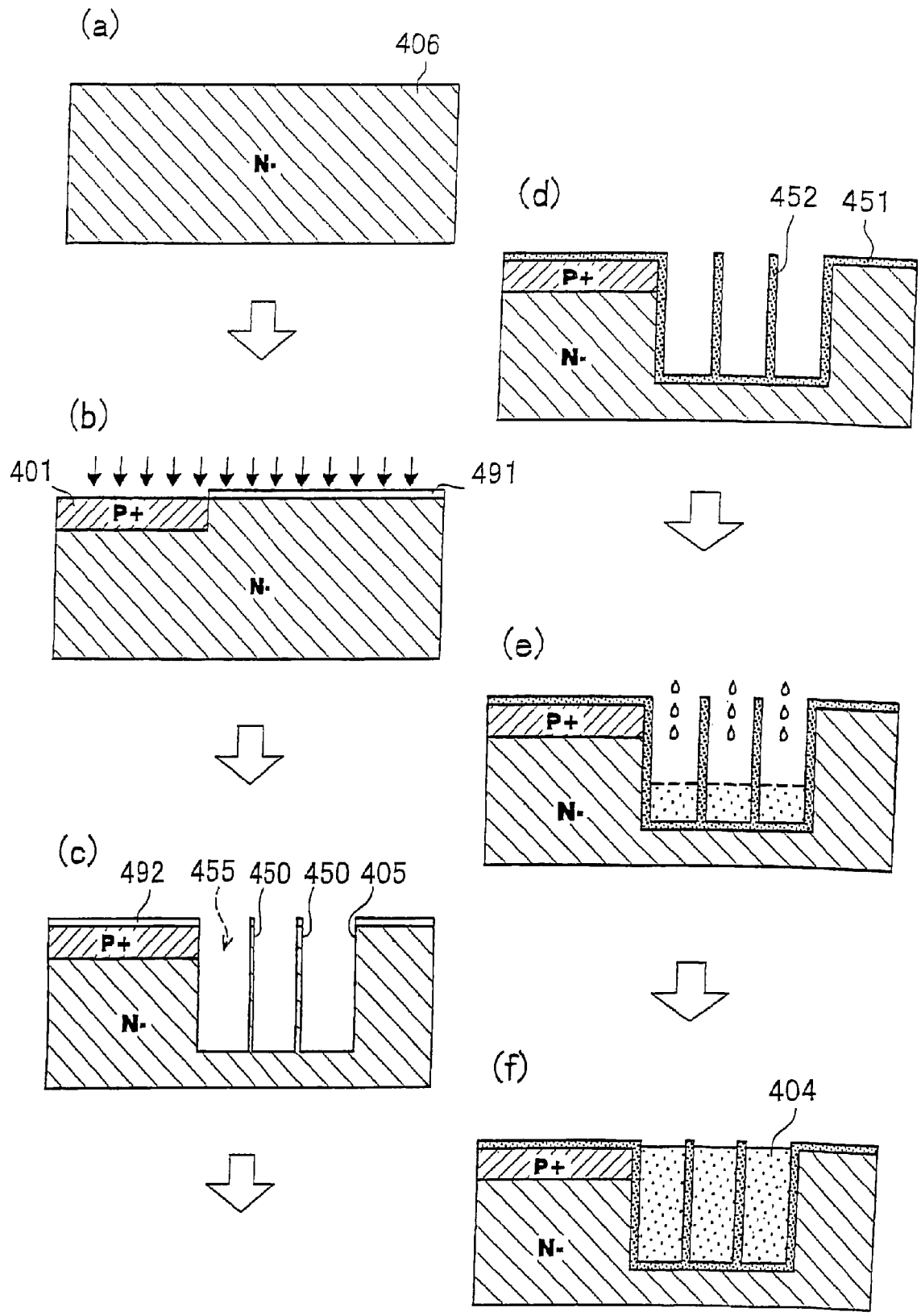
[Fig. 15]

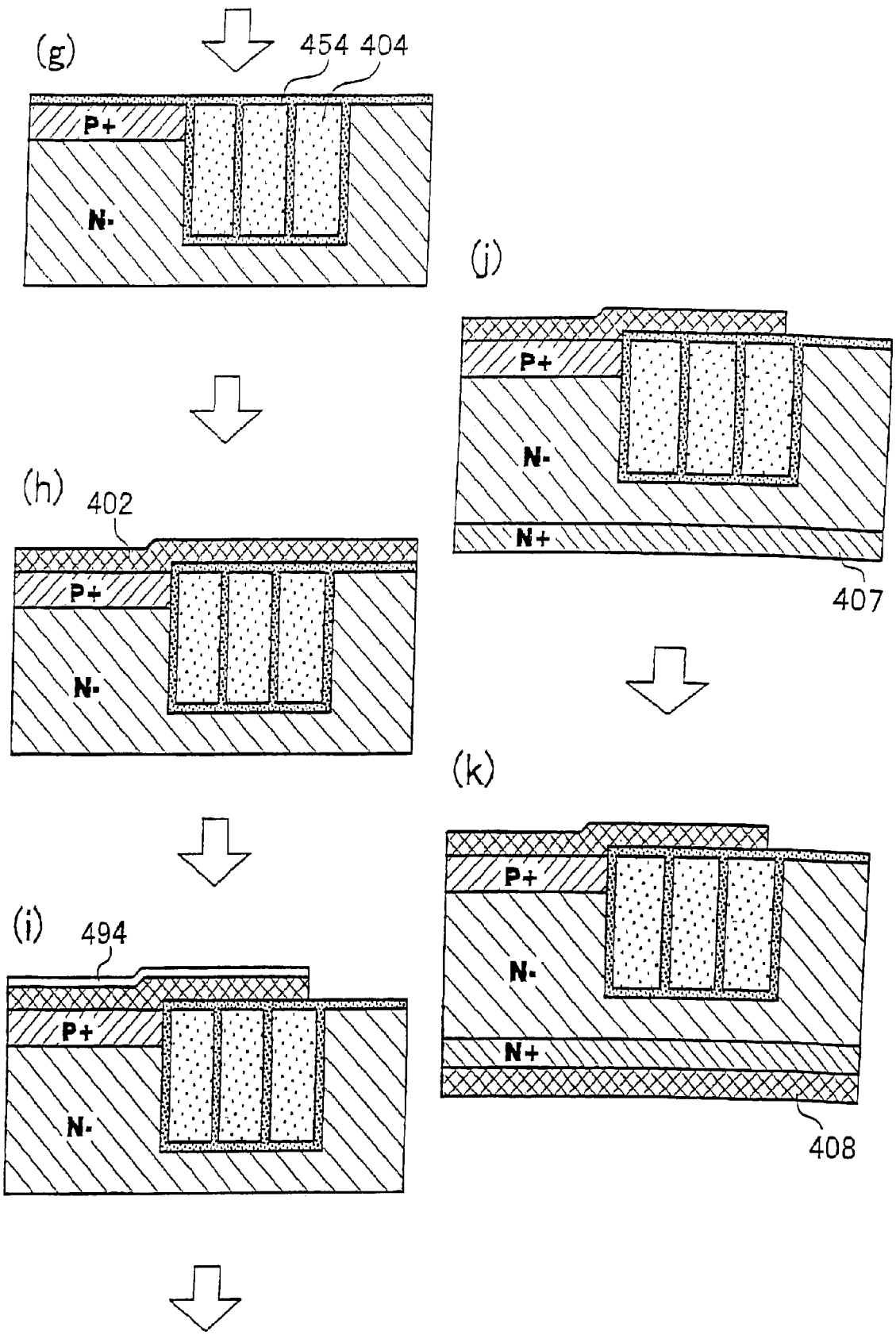
[Fig. 16]

SEMICONDUCTOR DEVICE AND A METHOD FOR PRODUCING THE SAME

TECHNICAL FIELD

The present invention relates to a semiconductor device having a configuration for enhancing electrostatic breakdown voltage. The present invention is particularly effective for a semiconductor device for supplying a large-current (a so-called power device). The present invention also relates to a semiconductor device having a shallow trench isolation structure; and to a method for producing the semiconductor device. More particularly, the present invention relates to a semiconductor device which can achieve high breakdown voltage while suppressing reliability degradation; and to a method for producing the semiconductor device.

BACKGROUND ART

In recent years, devices having a trench gate; for example, an MOSFET (U-MOS) and an insulated gate bipolar transistor (IGBT), have generally been employed as switching power devices. In such power devices, an important point is that leakage current does not flow in an "OFF" state in which no electric potential is applied to the gate. Attempts have been made to develop a power device having a high electrostatic breakdown voltage (i.e., the maximum voltage at which no leakage current flows).

The present applicant previously proposed, in, for example, Patent Document 1, enhancement of electrostatic breakdown voltage by providing a super-junction structure, and providing an insulating region at an outer peripheral portion of the device. As described in Patent Documents 2 and 3, a super-junction structure includes numerous p-layer-n-layer interfaces. In the super-junction structure, neighboring pn-interfaces jointly form a continuous depletion layer, to thereby create a wide and thick continuous depletion layer, whereby electrostatic breakdown voltage is enhanced. When such a super-junction structure is provided in a drift region of a U-MOS, or in a base region of an IGBT on the side where no channel is formed, in the super-junction structure, a region having the same conduction type as a channel (inversion layer) which is formed when the gate is ON must be formed so as to be connected to the channel.

FIG. 8.A shows the configuration of a U-MOS 900 disclosed in Patent Document 1. In the U-MOS 900, n-layers 21 and p$^-$-layers 22 are alternately juxtaposed (in a horizontal direction) on the top surface (i.e., the surface on the top side as viewed in the sheet of FIG. 8.A) of an n$^+$-substrate 10, thereby forming a super-junction structure 20. The super-junction structure 20 includes, for example, a plurality of the plate-like or columnar n-layers 21 and p$^-$-layers 22 provided on the top surface of the n$^+$-substrate 10. On the top of the super-junction structure 20 are provided p-body layers 30, and trench gates, each including a gate electrode G and a gate insulating film Ig, the p-body layers 30 and the trench gates being formed alternately. Source regions; i.e., n$^+$-layers 40, are formed so as to be in contact with the trench gates. The n$^+$-layers 40 are located so that they are connected to the n-layers 21 of the super-junction structure 20 via n-channels (inversion layers) which are formed in the p-body layers 30 when the gates are ON. A drain electrode D is formed on the entire bottom surface of the n$^+$-substrate 10, and a source electrode S is formed on the top surfaces of the p-body layers 30 and the n$^+$-layers 40.

The U-MOS 900 includes a plurality of unit cells which are continuously provided in a horizontal direction (i.e., in a left-right direction as viewed in the sheet of FIGS. 8.A and 8.B), one unit cell being shown in FIG. 8.A. The configuration of a unit cell at the extreme right of the U-MOS 900 will now be described with reference to FIG. 8.B. At the extreme right of the U-MOS 900, the super-junction structure 20 is terminated by a p$^-$-layer 22e provided to the immediate right of the n-layer 21 corresponding to the n$^+$-layer 40 formed on the right side of the right-end trench gate. An insulating region 90 having a width w (as measured in a horizontal direction) is formed so as to be in contact with the right surfaces of the p$^-$-layer 22e and the p-body layer 30 provided thereon. On the right side of the insulating region 90, a p$^-$-layer 25 is formed so as to extend to the end of the chip of the device. An upper end portion 90c of the insulating region 90 extends, by a predetermined width, over a left-side portion of the top surface of the p$^-$-layer 25 so that the right end of the source electrode S does not come into contact with the p$^-$-layer 25.

Thus, the super-junction structure 20 is formed in a so-called n-drift region of the n-channel U-MOS 900. In practice, the n-layers 21 serve as n-drift regions. In the U-MOS 900, when the gates are ON, electrons flow from the source electrode S, through the n$^+$-layers 40 (source regions), n-channels (inversion layers) formed in the p-body layers 30, the n-layers 21 serving as n-drift regions, and the n$^+$-substrate 10, to the drain electrode D. Meanwhile, when the gates are OFF, depletion layers are formed at the pn junction interfaces between the n-layers 21 and p$^-$-layers 22 constituting the super-junction structure 20, and extend throughout the super-junction structure 20, whereby flow of leakage current is prevented.

Conventionally, in connection with a semiconductor device requiring a structure of high breakdown voltage (e.g., a power device), a shallow trench isolation structure, in which the device is isolated by a trench containing an insulating substance, has been proposed. In order to achieve high breakdown voltage in a semiconductor device having such a shallow trench isolation structure, a trench having large depth and width is required.

Such a semiconductor device having a trench isolation structure is disclosed in, for example, Patent Document 4. In the disclosed semiconductor device, a plurality of silicon (Si) partition walls are provided in a trench having a large width. The Si partition walls are expanded through thermal oxidation treatment. Thus, the trench can contain silicon oxide ($SiO_2$); i.e., the large-width trench can contain an insulating substance.

For example, Patent Document 5 discloses a semiconductor device in which a trench contains an insulating material through spin coating. Specifically, in this semiconductor device, a trench having a large width contains an insulating substance by charging a liquid insulating material into the trench, followed by solidification of the insulating material.

[Patent Document 1] Japanese Patent Application Laid-Open (kokai) No. 2001-244461

[Patent Document 2] Japanese Patent Application Laid-Open (kokai) No. H11-233759

[Patent Document 3] Japanese Patent Application Laid-Open (kokai) No. H09-266311

[Patent Document 4] Japanese Patent Application Laid-Open (kokai) No. 2004-335568

[Patent Document 5] Japanese Patent Application Laid-Open (kokai) No. 2001-267411

DISCLOSURE OF THE INVENTION

[Problems to be Solved by the Invention]

As described in Patent Document 1, when the insulating region 90 has a width (as measured in a horizontal direction) of 2 μm, an electrostatic breakdown voltage of about 70 V is attained. However, according to additional simulation by the present inventors, even when the width (as measured in a horizontal direction) of the insulating region 90 is increased to, for example, 200 μm, electrostatic breakdown voltage is increased by only a small extent. Patent Document 1 also discloses a technique in which a plurality of insulating regions are repeatedly formed so as to surround the outer periphery of the device, with a p$^-$-layer being sandwiched between adjacent insulating regions. However, in this technique, in order to attain an electrostatic breakdown voltage of, for example, 1 kV, the outer periphery of the device must be surrounded by the repeatedly formed regions having a width of 800 μm. This means that the size of the device is increased by 1.6 mm, in a forward/backward direction and a left-right direction, with respect to the size of a substantial device region. Therefore, for example, the number of such devices formed per wafer is reduced, or each of the thus-formed devices requires a larger area in an apparatus to which the semiconductor device is applied; i.e., the semiconductor device is very disadvantageous in terms of efficiency.

Meanwhile, a conventional semiconductor device which is isolated by an insulating substance poses problems as described below. Specifically, as described in Patent Document 4, in order to entirely fill a trench with an insulating substance through thermal oxidation treatment of Si partition walls, the pitch of the Si partition walls must be reduced. Thus, since a space provided between the trench and an Si partition wall, or a space provided between adjacent Si partition walls has a very high aspect ratio, complicated processing is required. Even if such a space can be provided through processing, due to a small distance between adjacent Si partition walls, sticking is likely to occur. In contrast, when such a space has a low aspect ratio, the trench fails to contain a material, which imposes a limitation on enhancement of breakdown voltage. Through thermal oxidation treatment of the Si partition walls after processing, the width of the partition walls in the form of thermally oxidized film is almost doubled. Therefore, high residual stress arises in silicon crystals. Particularly, crystal defects are likely to arise locally at the corners of the trench, which may lead to reliability degradation in terms of breakdown voltage.

In the case where a trench contains an insulating material through spin coating as described in Patent Document 5, if the trench has a large width, the insulating material which has been temporarily introduced into the trench is discharged therefrom by means of centrifugal force. That is, when the width of a trench is increased so as to achieve high breakdown voltage, the trench may fail to sufficiently contain the insulating material. Also, a large width of a trench has a large surface area on which the liquid-form insulating material is solidified. Therefore, cracks or voids are generated in the thus-formed insulating film through film shrinkage during solidification or the subsequent thermal treatment, resulting in non-uniformity of the insulating film, and reliability degradation in terms of breakdown voltage.

In view of the foregoing, an object of the present invention is to provide a semiconductor device having a small-width region which surrounds the outer periphery of the device, and exhibiting enhanced electrostatic breakdown voltage.

Another object of the present invention is to provide a semiconductor device which can achieve high breakdown voltage while suppressing reliability degradation. Yet another object of the present invention is to provide a method for producing the semiconductor device.

SUMMARY OF THE INVENTION

A first characteristic feature of the present invention is drawn to a semiconductor device having a substrate; an emitter electrode or source electrode formed on the side of a top surface (hereinafter may be referred to as the "top surface side") of the substrate; a gate electrode formed on the top surface side of the substrate; and a collector electrode or drain electrode formed on the side of a bottom surface (hereinafter may be referred to as the "bottom surface side") of the substrate, characterized in that the device comprises an insulating region formed so as to surround an device-forming region provided on the device-forming surface of the substrate; and a drift region of the device-forming region, the drift region being in contact with the insulating region, is formed of a semiconductor layer having the same conduction type as that of a channel formed through application of an electric potential to the gate electrode. As used herein, the expression "an insulating region is formed so as to surround an device-forming region" is used in the case where an insulating region is provided so as to completely surround the device-forming region, as well as in the case where two insulating regions are provided so as to sandwich the device-forming region. The latter case corresponds to the case where, under the assumption that electrostatic breakdown preferentially occurs at, for example, two facing sides of a rectangular device region as described below, two insulating regions are provided so as to be in contact with the respective two sides of the device region. A semiconductor layer having the same conduction type as a channel formed through application of electric potential to the gate electrode may be provided at the insulating region side wall on the side opposite the drift region of the device-forming region that is in contact with the insulating region.

A second characteristic feature of the present invention resides in that the gate electrode is a trench gate.

A third characteristic feature of the present invention resides in that an outer peripheral portion of the emitter electrode or source electrode extends in a width of 20 μm or more over the top surface of the insulating region.

Preferably, the emitter electrode or source electrode is formed so as to extend over the entire top surface of the insulating region. In this case, electrostatic breakdown voltage is elevated to the highest level.

A fourth characteristic feature of the present invention resides in that the insulating region includes, in its interior, a dielectric region having a relative dielectric constant lower than that of the insulating region.

A fifth characteristic feature of the present invention resides in that a super-junction structure is formed in the drift region.

A sixth characteristic feature of the present invention is drawn to a semiconductor device having a trench isolation structure in which the device is isolated by a trench or trenches provided at a surface of a semiconductor substrate, characterized in that the device comprises an oxide layer which is provided on a surface layer of each trench, and on a portion in the vicinity of an opening of the trench; and an insulating film for covering the opening of the trench to provide a space in the trench, the film being in contact with the oxide layer.

The semiconductor device of the present invention has a trench isolation structure in which the device is isolated by the trench formed at the top surface of the semiconductor substrate. The opening of the trench is covered with the insulating film for hermetic sealing of the trench, whereby a space is provided in the trench. Thus, in the present invention, the trench has a dielectric constant lower than that of a trench containing an insulating film such as an $SiO_2$ film. Therefore, the device of the present invention can achieve high breakdown voltage. Since the opening of the trench is sealed with the insulating film, even when an electrode layer or an interlayer insulating layer is formed above the trench, the layer is prevented from entering the trench. Since the trench does not contain an insulating substance, the device does not involve problems which would otherwise arise when the trench contains an insulating substance (e.g., residual stress or cracking in the semiconductor substrate). Therefore, the device exhibits high reliability in terms of breakdown voltage.

In the semiconductor device of the present invention, more preferably, the trench includes, in its interior, an insulating partition wall which partitions the interior of the trench into a plurality of space regions, such that a tip end portion of the partition wall is in contact with the bottom surface of the insulating film. Specifically, when such an insulating partition wall is provided in the trench, the interior region of the trench can be partitioned into a plurality of regions as viewed in a thickness direction of the substrate. Therefore, the insulating film can be prevented from bending into the trench.

A seventh characteristic feature of the present invention is drawn to a method for producing a semiconductor device having a trench isolation structure, characterized in that the method comprises a trench formation step of forming a trench through etching through a mask pattern formed on a surface of a semiconductor substrate; a surface oxidation step of oxidizing the surface of the semiconductor substrate and a surface layer of the trench; and an insulating film attachment step of attaching an insulating film onto the surface of the semiconductor substrate, thereby providing a space in the trench.

In the semiconductor device production method of the present invention, an opening of the trench is sealed with the insulating film, to thereby provide a space in the trench. Therefore, according the production method of the present invention, the produced trench has a dielectric constant lower than that of a trench containing an insulating film such as an $SiO_2$ film. Therefore, the semiconductor device can achieve high breakdown voltage. Since the trench does not contain an insulating substance, the device does not involve problems which would otherwise arise when the trench contains an insulating substance (e.g., high residual stress or cracking in the semiconductor substrate). Therefore, the device exhibits high reliability in terms of breakdown voltage. The member which covers the opening of the trench is in the form of film. Thus, the opening of the trench can be easily covered by attaching the film onto the entire surface of the semiconductor substrate.

An eighth characteristic feature of the present invention resides in that, in the semiconductor device production method, more preferably, annealing treatment is performed in an oxidizing atmosphere after attachment of the insulating film. When annealing treatment is performed in an oxidizing atmosphere, adhesion can be enhanced between the insulating film and an oxide layer forming the surface of the semiconductor substrate.

More preferably, in the trench formation step, partition walls which partition the interior of the trench into a plurality of regions are formed together with formation of the trench, and, in the surface oxidation step, the surface layer of the trench and the partition walls are oxidized. When partition walls are provided in the trench, the insulating film can be prevented from bending into the trench. In this case, the partition walls may be provided at such an interval that the insulating film can be prevented from bending. Specifically, the interval between the partition walls is determined so that a predetermined interval is secured after oxidation of the partition walls. Therefore, during the trench formation step, a space between the partition walls does not exhibit high aspect ratio, leading to easy processing.

A ninth characteristic feature of the present invention is drawn to a semiconductor device having a trench isolation structure in which the device is isolated by a trench or trenches provided at the top surface of a semiconductor substrate, characterized in that the device comprises an insulating partition wall or insulating partition walls which partition the interior of each trench into two or more compartments, wherein each compartment provided through partitioning of the trench by the insulating partition wall is lined with an insulating member formed of an insulating material having a dielectric constant lower than that of $SiO_2$.

A tenth characteristic feature of the present invention resides in that the semiconductor device has a trench isolation structure in which the device is isolated by a trench or trenches provided at the top surface of a semiconductor substrate. The interior of each trench is partitioned into a plurality of regions by providing an insulating partition wall in the trench. Therefore, when the regions contain a liquid insulating material, material shrinkage, which occurs during solidification of the insulating material or the subsequent thermal treatment, is suppressed, and defects (e.g., cracks or voids) can be reduced. Thus, the device exhibits high reliability in terms of breakdown voltage. Since the regions in the trench contain an insulating material having a dielectric constant lower than that of $SiO_2$, so as to form an insulating member, the device can achieve high breakdown voltage.

An eleventh characteristic feature of the present invention is drawn to a method for producing a semiconductor device having a trench isolation structure, characterized in that the method comprises a trench formation step of forming a trench through etching through a mask pattern formed on a surface of a semiconductor substrate; a surface oxidation step of oxidizing the surface of the semiconductor substrate and a surface layer of the trench; and an insulating material filling step of filling the trench with an insulating material by adding the insulating material in the form of droplets into the trench through ink-jet printing, followed by solidification of the insulating material.

A twelfth characteristic feature of the present invention resides in that, in the semiconductor device production method, a trench is formed at the top surface of a semiconductor substrate; the surface layer of the trench is oxidized; and then an insulating material is added dropwise into the trench through ink-jet printing. Since the production method of the present invention employs ink-jet printing, the volume of droplets of the insulating material added and the position to which the insulating material is added can be accurately controlled, as compared with the case where spin coating is employed. Therefore, the insulating material is added dropwise only into the trench, and thus the trench can reliably contain the material. In addition, an additional step (e.g., etching of unnecessary portions, or planarization) is not required, leading to easy processing. The insulating material employed is preferably a material having a dielectric constant lower than that of $SiO_2$. Employment of a material having low dielectric constant can achieve high breakdown voltage.

In the insulating material filling step, more preferably, a plurality of operation cycles, each cycle including filling the trench with the insulating material in the form of droplets, and solidification of the insulating material, are performed in a repeated manner. Specifically, when the trench contains the insulating material through a plurality of cycles, the amount of shrinkage of the insulating material per cycle can be reduced. Therefore, occurrence of cracks or an increase in residual stress can be suppressed, and the resultant device exhibits higher reliability in terms of breakdown voltage.

More preferably, in the trench formation step, a partition wall which partitions the interior of the trench into a plurality of space regions is formed together with formation of the trench; in the surface oxidation step, the surface layer of the trench and the partition wall are oxidized; and, in the insulating material filling step, the insulating material is added dropwise into the space regions. Specifically, an insulating partition wall is provided in the trench through the trench formation step and the subsequent surface oxidation step. Subsequently, regions provided through partitioning of the trench by the insulating partition wall contain the insulating material through the insulating material filling step. Therefore, material shrinkage, which occurs during solidification of the liquid insulating material or the subsequent thermal treatment, is suppressed, and problems (e.g., occurrence of cracks or an increase in residual stress) can be reduced. Thus, the resultant device exhibits higher reliability in terms of breakdown voltage.

EFFECTS OF THE INVENTION

Since an insulating region is formed so as to surround a device-forming region, an outer peripheral portion of the device-forming region receives only a vertical electric field, and does not receive an oblique electric field from, for example, a periphery part, in which is provided outside the device-forming region, of the drain or collector electrode. That is, the outer peripheral portion of the device-forming region receives a uniform, vertical electric field in a manner similar to that of a portion of the device-forming region other than the outer peripheral portion. However, according to the below-described simulation, in the case of, for example, an n-channel semiconductor device, when a p-layer is formed so as to extend to a deep position of the device-forming region which is in contact with an insulating region, due to a large distance between the insulating region and a pn junction interface, a depletion layer fails to extend sufficiently, and the p-layer and a p-body layer exhibit a source electrode potential when the gate is OFF. This phenomenon occurs to a considerable extent at a portion which is in contact with the insulating region, and thus a depletion layer fails to be formed to reach a deep position. This phenomenon was found to impede formation of a depletion layer at the interface between the p-layer serving as a body region and an n-layer serving as a drift region at an outer peripheral portion of the device-forming region, and to reduce electrostatic breakdown voltage. Meanwhile, when a semiconductor layer provided at the outer peripheral portion of the device-forming region that is in contact with the insulating region has the same conduction type as a channel formed through application of electric potential to the gate electrode, in the case of, for example, an n-channel MOS or an n-channel IGBT, the semiconductor layer exhibits a drain electrode potential or a collector electrode potential when the gate is OFF, which does not impede formation of a depletion layer at the interface between an n-layer serving as a drift region and a p-layer serving as a body region.

The aforementioned configuration is effective for a semiconductor device including a trench gate, in which breakdown tends to occur preferentially in the vicinity of an insulating film provided below a gate electrode. This is because depletion is readily attained in a semiconductor layer which is in contact with the insulating film provided below the gate electrode. When an emitter electrode of an IGBT or a source electrode of an MOS is formed on an insulating region, a portion of the insulating region that is in contact with the electrode has an emitter electrode potential or a source electrode potential, and electric field distributed in the vicinity of the gate exhibits a potential nearly equal to the emitter electrode potential or the source electrode potential, breakdown is less likely to occur at the insulating film provided below the gate electrode or at the interface between a drift layer and a body layer. The width of an outer peripheral portion of the emitter or source electrode is preferably 20 μm or more, more preferably 80 μm or more.

When a dielectric region having lower relative dielectric constant is formed in the insulating region, the entirety of the insulating region exhibits low capacitance, and thus electrostatic breakdown voltage is enhanced. When a super-junction structure is provided, high electrostatic breakdown voltage can be achieved through the synergistic effect of providing the super-junction structure and the insulating region.

According to the present invention, there is attained a semiconductor device which can achieve high breakdown voltage while suppressing reliability degradation, as well as a method for producing the semiconductor device.

BRIEF DESCRIPTION OF THE DRAWINGS

FIG. 1 is a cross-sectional view showing the configuration of a U-MOS 100 according to a specific example of the present invention.

FIG. 2 is a graph showing electrostatic breakdown voltage characteristics under varied field plate lengths $W_S$ in the U-MOS 100 of Example 1.

FIG. 3 is a cross-sectional view showing the configuration of a U-MOS 950 according to Comparative Example.

FIG. 4 shows electric potential profiles obtained by applying electrostatic breakdown voltage to two U-MOSs according to another specific example of the present invention.

FIG. 5 is a cross-sectional view showing the configuration of an IGBT 200 according to another specific example of the present invention.

FIG. 6 is a graph showing the relation between field plate length $W_S$ and electrostatic breakdown voltage of the IGBT 200 of Example 3.

FIG. 7.A is a cross-sectional view schematically showing another example falling within the scope of the present invention.

FIG. 7.B is a cross-sectional view schematically showing another example falling within the scope of the present invention.

FIG. 7.C is a cross-sectional view schematically showing another example falling within the scope of the present invention.

FIG. 7.D is a cross-sectional view schematically showing another example falling within the scope of the present invention.

FIG. 7.E is a cross-sectional view schematically showing another example falling within the scope of the present invention.

FIG. 7.F is a cross-sectional view schematically showing another example falling within the scope of the present invention.

FIG. 7.G is a cross-sectional view schematically showing another example falling within the scope of the present invention.

FIG. 8 is a cross-sectional view showing the configuration of a conventional U-MOS 900.

FIG. 9 is a cross-sectional view showing the isolation structure of a semiconductor device according to Example 4 of the present invention.

FIG. 10 is a cross-sectional view of the semiconductor device shown in FIG. 9, as taken along line A-A.

FIG. 11 is an A-A cross-sectional view of an application of the semiconductor device shown in FIG. 9.

FIG. 12 shows a method for producing the semiconductor device according to Example 4 (part 1).

FIG. 13 shows a method for producing the semiconductor device according to Example 4 (part 2).

FIG. 14 is a cross-sectional view showing the isolation structure of a semiconductor device according to Example 5.

FIG. 15 shows a method for producing the semiconductor device according to Example 5 (part 1).

FIG. 16 shows a method for producing the semiconductor device according to Example 5 (part 2).

BEST MODES FOR CARRYING OUT THE INVENTION

Generally, the present invention is particularly effective for a semiconductor device including a trench gate, in which a channel is generally formed in a vertical direction. Examples of such a semiconductor device include a U-MOS and an IGBT. Next will be described a semiconductor device in which an n-channel is formed when the gate is ON. The present invention is also applicable to a semiconductor device in which a p-channel is formed. The present invention is also applicable to a power device employing a compound semiconductor (e.g., GaN, SiC, or a diamond semiconductor) or an organic material.

EXAMPLE 1

Electrostatic breakdown voltage of a U-MOS 100 having the following configuration was evaluated through simulation. FIG. 1 is a cross-sectional view showing the configuration of the U-MOS 100 according to the present Example. The U-MOS 100 shown in FIG. 1 is configured by replacing the insulating region 90 of the U-MOS 900 shown in FIG. 8.B by an $SiO_2$ insulating region 50 including air layers 60 therein, and by providing, on both sides of the insulating region 50, an n-layer 21e of a super-junction structure 20 and an n-layer 28 serving as an outer peripheral portion. In this case, the air layers 60 included in the insulating region 50 are in the form of uprightly provided window-like spaces, and the height of the layers 60 is equal to the overall thickness of semiconductor layers provided atop an n⁺-substrate 10. Thus, the super-junction structure 20 of the U-MOS 100 includes an n-layer 21 (on the left end side), a p-layer 22, and the n-layer 21e, and is terminated by the n-layer 21e, which is in contact with the insulating region 50 including the air layers 60 therein. A source electrode S is provided to extend over a width $W_S$ portion of the top surface of the insulating region 50 in which includes the air layers 60 are provided (hereinafter the width $W_S$ may be referred to as a "field plate length"). Simulation was performed under the assumption that the source electrode S is connected to a p-body layer 30 via a p⁺-layer 35.

The gist of the simulation is as follows. In the super-junction structure, the width (in a left-right direction as viewed in the sheet of FIG. 1) of each of the n-layers 21 (including the n-layer 21e) and the p-layer 22 was determined to be 0.5 μm, and the carrier concentration of each layer was determined to be $4.8 \times 10^{16}$ cm⁻³. Also, the carrier concentration of the p-body layer 30 was determined to be $4.8 \times 10^{16}$ cm⁻³. In the $SiO_2$ insulating region 50 including the air layers 60 therein, the width $d_1$ of an $SiO_2$ layer was determined to be 5 μm; the width $d_2$ of an air layer was determined to be 1 μm; and the total width $W_f$ of 24 $SiO_2$ layers and 23 air layers was determined to be 143 μm. Under these conditions, electrostatic breakdown voltage was simulated by varying, from 0 to 140 μm, the width (field plate length) $W_S$ of a portion of the source electrode S which covers the top surface of the insulating region 50. The results of simulation are shown in FIG. 2. FIG. 2 shows the relation between positive voltage applied to a drain electrode D (when the source electrode S and a gate electrode G of the U-MOS 100 are grounded) and source-drain leakage current. When $W_S$ is 0 μm (i.e., $W_S/W_f=0\%$), electrostatic breakdown voltage is 170 V, indicating a slight enhancement. When $W_S$ is 20 μm (i.e., $W_S/W_f=14\%$), electrostatic breakdown voltage is 480 V, indicating a considerable enhancement. When $W_S$ is 40 μm (i.e., $W_S/W_f=28\%$), electrostatic breakdown voltage is 780 V. When $W_S$ is 60 μm (i.e., $W_S/W_f=42\%$), 80 μm (i.e., $W_S/W_f=56\%$), or 100 μm (i.e., $W_S/W_f=70\%$), electrostatic breakdown voltage is 960 V, 1,070 V, or 1,130 V, respectively. As is clear from FIG. 2, when $W_S$ is 120 μm (i.e., $W_S/W_f=84\%$), electrostatic breakdown voltage is 1,160 V, which is a very high level. When $W_S$ is 140 μm (i.e., $W_S/W_f=93\%$), electrostatic breakdown voltage is 1,170 V, which is a saturation level of electrostatic breakdown voltage in the case of this configuration.

COMPARATIVE EXAMPLE

In this Comparative Example, electrostatic breakdown voltage of a U-MOS 950 having the configuration shown in FIG. 3 was evaluated through simulation. The U-MOS 950 shown in FIG. 3 is configured by replacing the layers on the sides of the $SiO_2$ insulating region 50 of the U-MOS 100 shown in FIG. 1, which includes the air layers 60 therein, by a p-layer 22e of a super-junction structure 20 and a p-layer 25 serving as an outer peripheral portion, respectively. In the U-MOS 950 having the configuration shown in FIG. 3, when the width $W_S$ of a portion of the source electrode S which covers the top surface of the insulating region 50 was determined to be 40 μm, electrostatic breakdown voltage was as low as 87 V.

In the results of Example 1 and the Comparative Example, when the semiconductor layer which is in contact with the insulating region 50 is not a p-layer but an n-layer; i.e., when the semiconductor layer has the same conduction type as a channel layer (inversion layer), electrostatic breakdown voltage is increased by a factor of 10. Thus, when the semiconductor layer which is in contact with the insulating region 50 has the same conduction type as a channel layer (inversion layer), the semiconductor device exhibits high electrostatic breakdown voltage. Conceivably, the semiconductor layer provided on the right side of the insulating region 50 (i.e., the n-layer 28 or the p-layer 25) does not affect electrostatic breakdown voltage. This is because the layer 28 or 25 exhibits the same electric potential as the n⁺-substrate 10. This is observed through simulation of the electric potential profile.

EXAMPLE 2

FIG. 4 shows effects of the air layers 60 included in the $SiO_2$ insulating region 50. FIG. 4.A shows an electric potential profile obtained in the case where, in the U-MOS 100 shown in FIG. 1, the SiO$_2$ insulating region 50 including the air layers 60 therein was replaced by an SiO$_2$ insulating region 55 having a width of about 90 μm and including no air layer, and an electrostatic breakdown voltage of 630 V was applied. The width of a portion of the source electrode S which covers the top surface of the insulating region 55 was determined to be 40 μm. Meanwhile, FIG. 4.B shows an electric potential profile obtained in the case where, in the U-MOS 100 shown in FIG. 1, the width d$_1$ of an SiO$_2$ layer was determined to be 5 μm; the width d$_2$ of an air layer was determined to be 1 μm; the total width W$_I$ of 12 SiO$_2$ layers and 11 air layers was determined to be 71 μm; the width W$_S$ of a portion of the source electrode S which covers the top surface of the insulating region 50 was determined to be 40 μm; and an electrostatic breakdown voltage of 780 V was applied. FIG. 4.B corresponds to a portion of the configuration shown in FIG. 1, the portion being above the n$^+$-substrate 10. The boundary between the n-layer 28 (serving as an outer peripheral portion) and the n$^+$-substrate 10 is omitted. In FIG. 4.B, the air layers 60 of FIG. 1 are represented by 11 vertically elongated rectangles. Although, in FIG. 1, the widths of the layers constituting the super-junction structure 20 are enlarged with respect to the width (in a left-right direction) of the SiO$_2$ insulating region 50, in FIG. 4.B, the super-junction structure 20 corresponds to a range from 0 μm (i.e., the left end) to 2 μm, and the SiO$_2$ insulating region 50 corresponds to a horizontal axis range from 2 μm to 73 μm. Unlike the case of FIG. 4.B, in FIG. 4.A, the SiO$_2$ insulating region 55, which includes no air layer 60, corresponds to a horizontal axis range from 2 μm to 95 μm. In FIG. 4.A, the equipotential surface (line) of 570 V is indicated by an arrow, and, in FIG. 4.B, the equipotential surface (line) of 640 V is indicated by an arrow. FIG. 4B shows an electric potential profile which is expanded in terms of electric potential as compared with that shown in FIG. 4.A, which indicates the reason why the configuration corresponding to FIG. 4.B exhibits an electrostatic breakdown voltage higher by 24%.

EXAMPLE 3

FIG. 5 is a cross-sectional view showing the configuration of an IGBT 200 according to the present Example. The IGBT 200 shown in FIG. 5 is configured by replacing the n$^+$-substrate 10, super-junction structure 20, and SiO$_2$ insulating region 50 (including the air layers 60 therein) of the U-MOS 100 of FIG. 1 by a p$^+$-substrate 15, an n-base 201, and an SiO$_2$ insulating region 55, respectively. Since the device is an IGBT, the electrode formed on the bottom surface of the p$^+$-substrate 15 serves as a collector electrode C; the counter electrode serves as an emitter electrode E; an n$^+$-layer 40 connected to the emitter electrode E serves as an emitter region; a p-layer 30 serves as a p-base region; and the n-base 201 serves as an n-base region. In the IGBT, an equipotential plate P is provided on the top of an n-layer 28 serving as a chip outer peripheral portion. Simulation was performed under the following conditions: the carrier concentration of the n-base 201 was determined to be 9×10$^{13}$ cm$^{-3}$, and the width W$_I$ of the SiO$_2$ insulating region 55 was determined to be 240 μm. Under these conditions, electrostatic breakdown voltage was simulated by varying, from 50 to 200 μm, the width W$_S$ of a portion of the emitter electrode E which covers the top surface of the insulating region 55. The results of simulation are shown in FIG. 6. FIG. 6 is a graph showing the relation between field plate length W$_S$ and electrostatic breakdown voltage of the IGBT 200. In accordance with an increase in W$_S$ from 50 μm to 200 μm, electrostatic breakdown voltage is considerably increased from 1,680 V to 2,020 V.

Modified Examples

As indicated by the above-described Examples, needless to say, the present invention encompasses modifications as shown in FIGS. 7.A to 7.G. Although all the modifications correspond to n-channel U-MOSs, the present invention also encompasses n-channel IGBTs, and p-channel U-MOSs and IGBTs.

The present invention encompasses a configuration as shown in FIG. 7.A, in which no super-junction structure is provided; an insulating region is formed of one dielectric material; and field plate length is zero. The present invention also encompasses a configuration as shown in FIG. 7.B, in which no super-junction structure is provided; an insulating region is formed of one dielectric material; and field plate length is greater than zero.

The present invention also encompasses a configuration as shown in FIG. 7.C, in which a super-junction structure is provided in an n-drift region; an n-layer of the super-junction structure is in contact with an insulating region; the insulating region is formed of one dielectric material; and field plate length is zero.

The present invention also encompasses a configuration as shown in FIG. 7.D, in which a super-junction structure is provided in an n-drift region; an n-layer of the super-junction structure is in contact with an insulating region; the insulating region is formed of one dielectric material; and field plate length is greater than zero.

The present invention also encompasses a configuration as shown in FIG. 7.E, in which no super-junction structure is provided; field plate length is not zero; and an insulating region is formed of two dielectric materials.

The present invention also encompasses a configuration as shown in FIG. 7.F, which is a modification of the configuration of FIG. 1, wherein a dielectric region 60 of low relative dielectric constant included in an insulating region 50 is in the form of, for example, a plurality of spherical spaces which are independent of one another even in a depth direction.

The present invention also encompasses a configuration as shown in FIG. 7.G, which is a modification of the configuration of FIG. 1, wherein a dielectric region 60 of low relative dielectric constant included in an insulating region 50 is in the form of a single closed space.

The present invention also encompasses a semiconductor device having an insulating region which is formed as described below in Example 4 or 5.

In the present invention, no particular limitation is imposed on the insulating region width W$_I$. However, as described above, a width W$_I$ of 50 μm or more is effective. The width W$_I$ is preferably 75 μm or more, more preferably 100 μm or more. When the ratio of field plate length W$_S$ to insulating region width W$_I$; i.e., W$_S$/W$_I$, is 10% or more, remarkable effects are obtained. The ratio W$_S$/W$_I$ is preferably 20% or more, more preferably 40% or more. The ratio W$_S$/W$_I$ may be 100%.

As described above in the Examples, in the case of, for example, a device having a single channel, the super-junction structure provided in the device may be a super-junction structure of minimum unit including an n-layer, a p-layer, and an n-layer which are successively provided in a horizontal direction.

EXAMPLE 4

In Example 4, the present invention is applied to a power device mounted in, for example, an electric vehicle, and to a method for producing the power device.

A semiconductor device 300 according to Example 4 has a configuration shown in a cross-sectional view of FIG. 9. The semiconductor device 300 includes an n⁻-substrate 306; a p⁺-diffusion region 301 provided on the top surface side of the substrate; and an n⁺-diffusion region 307 provided on the bottom surface side of the substrate. The semiconductor device 300 includes an anode 302 which is in contact with the p⁺-diffusion region 301, and a cathode 308 which is in contact with the n⁺-diffusion region 307, wherein the PN junction between the p⁺-diffusion region 301 and the n⁻-substrate 306 forms a diode.

The semiconductor device 300 includes a trench 305 formed on the top surface side of the n⁻-substrate 306, and has a trench isolation structure in which semiconductor device is isolated by the trench 305. An $SiO_2$ layer 351 is formed on the surface layer of the trench 305, and $SiO_2$ partition walls 352 are formed in the interior of the trench 305. As shown in FIG. 10, the interior of the trench 305 is partitioned by the $SiO_2$ partition walls 352 into a plurality of space regions 353. The layout of the $SiO_2$ partition walls 352 is not necessarily limited to the grid-like layout shown in FIG. 10, but may be, for example, a honeycomb layout as shown in FIG. 11. That is, no particular limitation is imposed on the partition wall layout, so long as the interior region of the trench 305 can be evenly partitioned into a plurality of the space regions 353 as viewed in a thickness direction of the substrate.

A lamination insulating film 303 is provided at the opening of the trench 305 so that the opening of the trench 305 is sealed with the film. The lamination insulating film 303 may be made of an inorganic material such as silsesquioxane. Since the lamination insulating film 303 is provided so as to cover the trench 305, the space regions 353 provided in the trench 305 are hermetically sealed. The tip ends of the $SiO_2$ partition walls 352 provided in the trench 305 are in contact with the bottom surface of the lamination insulating film 303 so that the partition walls 352 support the film. That is, the $SiO_2$ partition walls 352 have a function of preventing the lamination insulating film 303 from bending.

The semiconductor device 300, in which the space regions 353 are provided in the trench 305, has the following characteristic feature. Specifically, since spaces are provided in the trench 305, the device-isolating region comprising the trench 305 exhibits a dielectric constant lower than that of $SiO_2$ film, and thus the device can achieve high breakdown voltage. In other words, when breakdown voltage of the semiconductor device is maintained equal to that of a conventional one, the size of the device-isolating region of the device can be reduced.

No particular limitation is imposed on the $SiO_2$ partition walls 352 provided in the trench 305, so long as bending of the lamination insulating film 303 can be prevented. Therefore, the partition walls are provided at a large interval. In other words, when the lamination insulating film 303 exhibits sufficient rigidity, the $SiO_2$ partition walls 352 are not required to be provided. Thus, the space regions 353 are not required to have high aspect ratio, leading to easy processing. Since the $SiO_2$ partition walls 352 are provided at a large interval, sticking between adjacent partition walls can be avoided.

As described above, spaces are provided in the trench 305; i.e., filling the trench with an insulating substance through thermal oxidation treatment of the partition walls, or through charging of a liquid insulating material, is not needed. Therefore, stress applied to the silicon substrate can be reduced, and occurrence of crystal defects, etc. can be suppressed. In addition, the device does not involve problems which would otherwise arise when the trench contains an insulating layer (e.g., occurrence of cracks or voids). Therefore, the semiconductor device 300 exhibits high reliability in terms of breakdown voltage.

When the space regions 353 contain an inert gas (e.g., Ar, Xe, or N), device characteristics are further improved. When the pressure in the space regions are regulated to be higher than the outside pressure, impurities which cause deterioration of device characteristics (e.g., water and mobile ions) can be prevented from entering the space regions.

Next will be described a method for producing the semiconductor device 300 with reference to FIGS. 12 and 13. In the production method, as shown in FIG. 12(a), an n-type silicon substrate (n⁻-substrate 306) is employed as a starting substrate.

Firstly, a photoresist 391 is applied onto the top surface of the silicon substrate, followed by patterning for formation of a p⁺-diffusion region 301. Thereafter, as shown in FIG. 12(b), a p⁺-diffusion region 301 is formed through ion implantation and the subsequent annealing treatment. Examples of impurities which may be employed as acceptors include boron (B) and boron fluoride ($BF_2$). After formation of the p⁺-diffusion region 301, the photoresist 391 is removed.

Subsequently, a photoresist 392 is applied onto the top surface of the silicon substrate, followed by patterning for formation of a device-isolating trench 305 and $SiO_2$ partition walls 352. Thereafter, as shown in FIG. 12(c), a trench 305 and Si partition walls 350 are formed through reactive ion etching by use of the photoresist 392 as a masking material. Specifically, space regions 353 are provided. The Si partition walls 350 become $SiO_2$ partition walls 352 through the subsequent thermal oxidation treatment. After formation of the trench 305 and the Si partition walls, the photoresist 392 is removed.

Subsequently, as shown in FIG. 12(d), the surface layer of the trench 305 and the Si partition walls 350 are subjected to thermal oxidation treatment. Through this oxidation treatment, an $SiO_2$ layer 351 is formed on the surface layer of the trench 305, and the Si partition walls 350 become $SiO_2$ partition walls 352. In this case, steam oxidation treatment or dry oxidation treatment is performed at, for example, 1,000° C. or higher, to thereby form an $SiO_2$ layer 351 having a thickness of 1 μm to 3 μm.

Subsequently, as shown in FIG. 12(e), a lamination insulating film 303 is attached onto the top surface of the silicon substrate. In this case, the lamination insulating film 303 is attached so as to cover the entire surface of a wafer. Thus, the opening of the trench 305 is sealed, and hermetically sealed spaces are provided in the trench 305. Thereafter, when the lamination insulating film 303 is made of a photosensitive material, the film 303 is subjected to patterning through photolithography, and unnecessary portions are removed through development. In contrast, when the lamination insulating film 303 is made of a non-photosensitive material, a resist pattern 393 is formed on the lamination insulating film 303, and unnecessary portions are removed through etching. Through this procedure, as shown in FIG. 12(f), the lamination insulating film 303 is provided so as to cover only the trench 305. Thereafter, annealing treatment is performed in an oxidizing atmosphere at, for example, 1,000° C. or lower. Through this annealing treatment, adhesion is achieved between the lamination insulating film 303 and the $SiO_2$ layer 351 (serving as an underlying layer), as well as between the film 303 and the $SiO_2$ partition walls 352. Thereafter, unnecessary portions of the $SiO_2$ layer 351 are removed through photoresist application and patterning, and the subsequent etching.

Subsequently, as shown in FIG. 13(g), an electrode layer (for an anode 302) is formed on the top surface of the silicon substrate. The electrode layer may be formed through, for example, sputtering or vapor deposition. The electrode layer may be formed from aluminum or a similar material. Since the opening of the trench 305 is sealed with the lamination insulating film 303, the electrode material is prevented from entering the trench 305.

Subsequently, a photoresist 394 is applied onto the electrode layer, followed by patterning for formation of an anode 302. Thereafter, as shown in FIG. 13(h), an anode 302 is formed through reactive ion etching or wet etching by use of the photoresist 394 as a masking material.

Subsequently, as shown in FIG. 13(i), an $n^+$-diffusion region 307 is formed on the bottom surface of the silicon substrate through ion implantation and the subsequent annealing treatment. Examples of impurities which may be employed as donors include arsenic (As) and phosphorus (P). Finally, as shown in FIG. 13(j), an electrode layer (for a cathode 308) is formed on the bottom surface of the silicon substrate. The electrode layer may be formed through, for example, sputtering or vapor deposition. The electrode layer may be formed from aluminum or a similar material. Hydrogen annealing may be performed at about 450° C. in order to enhance adhesion between the electrode layer and the silicon substrate. The above-described production method produces the semiconductor device 300, in which the opening of the trench 305 is sealed with the lamination insulating film 303.

As described above in detail, in the semiconductor device 300, the opening of the trench 305 is covered with the lamination insulating film 303 so that the interior of the trench 305 is hermetically sealed. Thus, the space regions 353 are provided in the trench 305. Therefore, in the semiconductor device 300, the trench 305 has a dielectric constant lower than that of a trench containing an insulating film (e.g., $SiO_2$ film). Therefore, the semiconductor device can achieve high breakdown voltage. Since the trench 305 does not contain an insulating substance, the semiconductor device does not involve problems which would otherwise arise when the trench contains an insulating substance (e.g., high residual stress or cracking in the semiconductor substrate). Therefore, the semiconductor device exhibits high reliability in terms of breakdown voltage. That is, the semiconductor device can achieve high breakdown voltage while suppressing reliability degradation.

In the semiconductor device 300, the $SiO_2$ partition walls 352 are provided in the trench 305. Thus, the interior of the trench 305 can be partitioned into a plurality of regions as viewed in a thickness direction of the substrate. Therefore, the lamination insulating film 303 can be prevented from bending into the trench 305. The $SiO_2$ partition walls 352 may be provided at such an interval that the lamination insulating film 303 can be prevented from bending. Specifically, the interval between the Si partition walls 350 is determined in advance so that a predetermined interval is secured after oxidation of the Si partition walls 350. Therefore, during formation of the trench 305, a space between the Si partition walls 350 does not exhibit high aspect ratio, leading to easy processing.

In the semiconductor device 300, the lamination insulating film 303, which covers the opening of the trench 305, is attached onto the entire surface of the wafer. Therefore, the opening of the trench 305 can be easily sealed.

In the semiconductor device 300, annealing treatment is performed in an oxidizing atmosphere after attachment of the lamination insulating film 303. Therefore, adhesion is enhanced between the lamination insulating film 303 and the $SiO_2$ layer 351.

EXAMPLE 5

A semiconductor device 400 according to Example 5 has a configuration shown in a cross-sectional view of FIG. 14. The semiconductor device 400 includes an $n^-$-substrate 406; a $p^+$-diffusion region 401 provided on the top surface side of the substrate; and an $n^+$-diffusion region 407 provided on the bottom surface side of the substrate. The semiconductor device 400 includes an anode 402 which is in contact with the $p^+$-diffusion region 401, and a cathode 408 which is in contact with the $n^+$-diffusion region 407, wherein the PN junction between the $p^+$-diffusion region 401 and the $n^-$-substrate 406 forms a diode.

The semiconductor device 400 includes a trench 405 formed on the top surface side of the $n^-$-substrate 406, and has an device isolation structure in which the device is isolated by the trench 405. An $SiO_2$ layer 451 is formed on the surface layer of the trench 405, and $SiO_2$ partition walls 452 are formed in the interior of the trench 405 at a predetermined interval. The interior of the trench 405 is partitioned by the $SiO_2$ partition walls 452 into a plurality of insulating material regions 404 as viewed in a thickness direction of the substrate.

The insulating material regions 404 provided through partitioning of the trench 405 by the $SiO_2$ partition walls 452 contain an insulating filling material having a dielectric constant lower than that of thermally-oxidized film. In this point, the semiconductor device 400 differs from the semiconductor device according the example 4, in which space regions are provided through partitioning by the $SiO_2$ partition walls 352. Examples of the insulating filling material which may be employed include silsesquioxane. A capping oxide film 454 is formed above the opening of the trench 405; i.e., above the insulating material regions 404. In this point, the semiconductor device 400 differs from the semiconductor device according the example 4, in which the opening of the trench 305 is sealed with the lamination insulating film 303.

In the semiconductor device 400, the $SiO_2$ partition walls 452 are provided in the trench 405, and the insulating material regions 404 provided through partitioning of the trench by the $SiO_2$ partition walls 452 contain an insulating filling material having a dielectric constant lower than that of $SiO_2$ film. Therefore, the semiconductor device 400 has the following characteristic feature. Specifically, since the regions 404 contain an insulating filling material having a dielectric constant lower than that of $SiO_2$ film, the semiconductor device can achieve high breakdown voltage. In other words, when breakdown voltage of the semiconductor device is maintained equal to that of a conventional one, the size of a device-isolating region of the device can be reduced.

The interior region of the trench 405 is partitioned by the $SiO_2$ partition walls 452. That is, each of the thus-partitioned regions, which contain an insulating filling material, has a small size. Therefore, material shrinkage, which occurs during solidification of a liquid insulating material or the subsequent thermal treatment, is suppressed, and thus problems (e.g., non-uniform distribution of the insulating material, and occurrence of cracks) can be reduced.

Next will be described a method for producing the semiconductor device 400 with reference to FIGS. 15 and 16. In the production method, as shown in FIG. 15(a), an n-type silicon substrate ($n^-$-substrate 406) is employed as a starting substrate.

Firstly, a photoresist 491 is applied onto the top surface of the silicon substrate, followed by patterning for formation of a p⁺-diffusion region 401. Thereafter, as shown in FIG. 15(b), a p⁺-diffusion region 401 is formed through ion implantation and the subsequent annealing treatment. Examples of impurities which may be employed as acceptors include boron (B) and boron fluoride (BF$_2$). After formation of the p⁺-diffusion region 401, the photoresist 491 is removed.

Subsequently, a photoresist 492 is applied onto the top surface of the silicon substrate, followed by patterning for formation of a device-isolating trench 405 and SiO$_2$ partition walls 452. Thereafter, as shown in FIG. 15(c), a trench 405 and Si partition walls 450 are formed through reactive ion etching by use of the photoresist 492 as a masking material. Specifically, spaces 455 for insulating material regions 404 are provided. The Si partition walls 450 become SiO$_2$ partition walls 452 through the subsequent thermal oxidation treatment. After formation of the trench 405 and the Si partition walls, the photoresist 492 is removed.

Subsequently, as shown in FIG. 15(d), the surface layer of the trench 405 and the Si partition walls 450 are subjected to thermal oxidation treatment. Through this oxidation treatment, an SiO$_2$ layer 451 is formed on the surface layer of the trench 405, and the Si partition walls 450 become SiO$_2$ partition walls 452. In this case, steam oxidation treatment or dry oxidation treatment is performed at, for example, 1,000° C. or higher, to thereby form an SiO$_2$ layer 451 having a thickness of 1 μm to 3 μm.

Subsequently, as shown in FIG. 15(e), an insulating filling material is added in the form of droplets into the trench 405 through ink-jet printing. The insulating filling material may be, for example, silsesquioxane having a viscosity of 10 cP or thereabouts. The volume of the droplets falls within a range of several pL to several tens of pL. Thereafter, the insulating filling material is solidified, whereby the trench 405 contains the insulating material as shown in FIG. 15(f). The trench 405 may contain the insulating filling material through a single operation. Alternatively, the trench 405 may contain the insulating filling material by repeatedly performing a plurality of operation cycles, each including dropwise addition and solidification of the material. When the trench contains the insulating filling material through a plurality of the operation cycles, the insulating filling material can be gradually solidified, and cracks or voids, which would otherwise be generated through film shrinkage during solidification or the subsequent thermal treatment, can be reduced.

After completion of filling and solidification of the insulating filling material 404, as shown in FIG. 16(g), a capping oxide film 454 is formed on the surface of the insulating filling material 404 for interface state reduction. The film formed for interface state reduction is not necessarily limited to an oxide film, but may be, for example, a nitride film. Thereafter, unnecessary portions of the SiO$_2$ layer 451 are removed through photoresist application and patterning, and the subsequent etching.

Subsequently, as shown in FIG. 16(h), an electrode layer (an anode 402) is formed on the top surface of the silicon substrate. The electrode layer may be formed through, for example, sputtering or vapor deposition. The electrode layer may be formed from aluminum or a similar material.

Subsequently, a photoresist 494 is applied onto the electrode layer, followed by patterning for formation of an anode 402. Thereafter, as shown in FIG. 16(i), an anode 402 is formed through reactive ion etching or wet etching by use of the photoresist 494 as a masking material.

Subsequently, as shown in FIG. 16(j), an n⁺-diffusion region 407 is formed on the bottom surface of the silicon substrate through ion implantation and the subsequent annealing treatment. Examples of impurities which may be employed as donors include arsenic (As) and phosphorus (P). Finally, as shown in FIG. 16(k), an electrode layer (for a cathode 408) is formed on the bottom surface of the silicon substrate. The electrode layer may be formed through, for example, sputtering or vapor deposition. The electrode layer may be formed from aluminum or a similar material. Hydrogen annealing may be performed at about 450° C. in order to enhance adhesion between the electrode layer and the silicon substrate. The above-described production method produces the semiconductor device 400, in which the trench 405 is closed with the capping oxide film 454.

As described above in detail, in the semiconductor device 400, the SiO$_2$ partition walls 452 are provided in the trench 405, and the interior of the trench 405 is partitioned into a plurality of the insulating material regions 404. Therefore, when the insulating material regions 404 contain an insulating filling material, material shrinkage, which occurs during solidification or the subsequent thermal treatment, is suppressed, and defects (e.g., cracks or voids) can be reduced. Thus, the semiconductor device exhibits high reliability in terms of breakdown voltage. Since the trench 405 contains an insulating material having a dielectric constant lower than that of SiO$_2$, so as to form an insulating member, the semiconductor device can achieve high breakdown voltage.

In the semiconductor device 400, an insulating filling material is added dropwise into the trench 405 through ink-jet printing. Since ink-jet printing is employed, the volume of droplets of the insulating filling material added and the position to which the material is added can be accurately controlled, as compared with the case where spin coating is employed. Therefore, the insulating filling material is added dropwise only into the trench 405, and thus the trench 405 can reliably contain the material. In addition, an additional step (e.g., etching of unnecessary portions, or planarization) is not required, leading to easy processing.

The above-described semiconductor devices are merely embodiments of the present invention, and the invention is not limited thereto. Therefore, needless to say, various improvements and modifications may be made to the present invention without departing from the scope thereof. For example, a p-type semiconductor region and an n-type semiconductor region may be interchanged with each other. A partition wall provided in a trench may be formed of an insulating film other than oxide film (e.g., nitride film), or may be formed of a composite film. A semiconductor employed is not limited to silicon, but may be another semiconductor species (e.g., SiC, GaN, or GaAs). The semiconductor devices according to the embodiments are applicable to MOS transistors and IGBTs.

The invention claimed is:

1. A semiconductor device having a substrate; an emitter electrode or source electrode formed on a top surface side of said substrate; a trench gate electrode formed in a trench formed from said top surface side of said substrate; and a collector electrode or drain electrode fanned an a bottom surface side of said substrate, said device comprising:

an insulating region formed so as to surround a device-forming region provided on a device-forming surface of said substrate;

a first layer formed vertically to said top surface on a side of said trench gate electrode;

a second layer having a conduction type opposite to a conduction type of said first layer, being parallel to said first layer; and a third layer being in contact with said insulating region, and having the same conduction type as that of said first layer and a channel formed through application of an electric potential to said trench gate electrode.

2. A semiconductor device us described in claim 1, wherein an outer peripheral portion of said emitter electrode or source electrode extends in a width of 20 μm or more over said cop surface of said insulating region.

3. A semiconductor device as described in claim 1, wherein an outer peripheral portion of said emitter electrode or source electrode extends in a width from 20% to 100% of a width of said cop surface of said insulating region.

4. A semiconductor device as described in claim 1, wherein said insulating region includes, in its interior, a dielectric region having a relative dielectric constant lower than that of said insulating region.

5. A semiconductor device as described in claim 3, wherein said insulating region includes, in its interior, a dielectric region having a relative dielectric constant lower than that of said insulating region.

6. A semiconductor device as described in claim 2, wherein said insulating region includes, in its interior, a dielectric region having a relative dielectric constant lower than that of said insulating region.

7. A semiconductor device as described in claim 1, wherein said insulating region comprises:
   an isolation trench for isolating said device-forming region;
   an insulating layer which is provided on a portion in the vicinity of an opening of said isolation trench; and
   an insulating film for covering said opening of said isolation trench to provide a space in said isolation trench, said insulating film being in contact with said insulating layer.

8. A semiconductor device as described in claim 7, wherein said isolation trench includes, in its interior, an insulating partition wall which partitions said interior of said isolation trench into a plurality of space regions, such that a tip end portion of said partition wall is in contact with a bottom surface of said insulating film.

9. A semiconductor device as described in claim 1, wherein said insulating region comprises:
   an isolation trench for isolating said device-forming region; and
   an insulating partition wall which partitions an interior of said isolation trench into two or more compartments,
      wherein each compartment provided through partitioning of said isolation trench by said insulating partition wall is lined with an insulating member formed of an insulating material having a dielectric constant lower than that of $SiO_2$.

* * * * *

UNITED STATES PATENT AND TRADEMARK OFFICE
CERTIFICATE OF CORRECTION

PATENT NO. : 7,569,875 B2 Page 1 of 1
APPLICATION NO. : 11/717790
DATED : August 4, 2009
INVENTOR(S) : Suzuki et al.

It is certified that error appears in the above-identified patent and that said Letters Patent is hereby corrected as shown below:

Col. 18 Line 56 should be corrected as follows: "collector electrode or drain electrode ~~fanned an~~ formed on a bottom"

Col. 19 Line 3 should be corrected as follows: "A semiconductor ~~us~~ as described in claim 1, wherein"

Col. 19 Line 5 should be corrected as follows: "electrode extends in a width of 20 μm or more over said ~~oop~~ top"

Col. 19 Line 10 should be corrected as follows: "said ~~oop~~ top surface of said insulating region."

Signed and Sealed this

Third Day of November, 2009

David J. Kappos
*Director of the United States Patent and Trademark Office*